(12) United States Patent
Yoshida et al.

(10) Patent No.: US 11,329,514 B2
(45) Date of Patent: May 10, 2022

(54) ELECTRONIC CIRCUIT, MODULE, AND SYSTEM

(71) Applicants: Seiko Holdings Kabushiki Kaisha, Tokyo (JP); ABLIC Inc., Tokyo (JP)

(72) Inventors: Yoshifumi Yoshida, Chiba (JP); Noboru Kawai, Chiba (JP); Fumiyasu Utsunomiya, Tokyo (JP)

(73) Assignees: SEIKO HOLDINGS KABUSHIKI KAISHA, Tokyo (JP); ABLIC INC., Tokyo (JP)

( * ) Notice: Subject to any disclaimer, the term of this patent is extended or adjusted under 35 U.S.C. 154(b) by 0 days.

(21) Appl. No.: 17/186,842

(22) Filed: Feb. 26, 2021

(65) Prior Publication Data

US 2021/0281115 A1 Sep. 9, 2021

(30) Foreign Application Priority Data

Mar. 3, 2020 (JP) .............................. JP2020-036247
Dec. 3, 2020 (JP) .............................. JP2020-201342

(51) Int. Cl.

| | |
|---|---|
| *B60R 25/40* | (2013.01) |
| *H02J 50/20* | (2016.01) |
| *H02J 50/40* | (2016.01) |
| *H05K 5/02* | (2006.01) |
| *H02M 3/04* | (2006.01) |
| *H02J 9/00* | (2006.01) |

(52) U.S. Cl.
CPC ............ *H02J 50/20* (2016.02); *H02J 50/402* (2020.01); *H02M 3/04* (2013.01); *H05K 5/0217* (2013.01); *B60R 25/40* (2013.01); *H02J 9/005* (2013.01)

(58) Field of Classification Search
CPC .......... H02J 50/20; H02J 50/402; H02J 9/005; H02M 3/04; H02M 7/05; H02M 7/08; H02M 7/103; H05K 5/0217; B60R 25/40
See application file for complete search history.

(56) References Cited

U.S. PATENT DOCUMENTS 10,650,299 B2 * 5/2020 Bongers .................. G16H 40/63
2010/0176202 A1 * 7/2010 Teraoka .................. H02J 50/12
235/492

FOREIGN PATENT DOCUMENTS

JP 2011-024332 A 2/2011

* cited by examiner

*Primary Examiner* — Daniel Cavallari
(74) *Attorney, Agent, or Firm* — Crowell & Moring LLP

(57) ABSTRACT

A convenient electronic circuit in which a switch is able to be switched through electric power obtained using weak radio waves is provided. An electronic circuit includes: a switch configured to switch a connection state between a power supply configured to output DC electric power and a load; a first antenna capable of receiving radio waves; a second antenna capable of receiving radio waves; a first power conversion circuit configured to convert electric power received by the first antenna into DC electric power and output the converted DC electric power from a first DC power output terminal; a second power conversion circuit configured to convert electric power received by the second antenna into DC electric power and output the converted DC electric power from a second DC power output terminal; and a control circuit configured to switch a connection state of the switch when a difference between electric power input from a first input terminal and electric power input from a second input terminal is larger than a predetermined value.

20 Claims, 25 Drawing Sheets

| IN | OUT | Q1 | Q2 | Q3 | Q4 |
|---|---|---|---|---|---|
| L | L | OFF | ON | ON | OFF |
| H | H | ON | OFF | OFF | ON |

| | 7222 (OUT) |
|---|---|
| $I_{INP} - G \times I_{INM} \geq I_{DET}$ | H |
| $I_{INP} - G \times I_{INM} < I_{DET}$ | L |

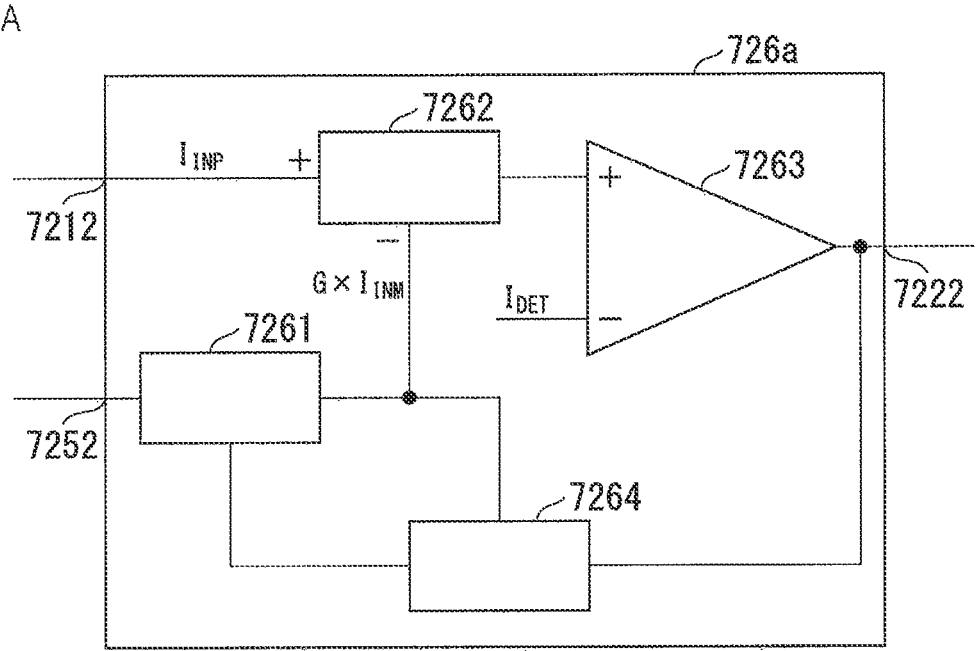

ELECTRONIC CIRCUIT, MODULE, AND SYSTEM

RELATED APPLICATIONS

This application claims priority to Japanese Patent Application Nos. 2020-036247, filed on Mar. 3, 2020, and 2020-201342, filed on Dec. 3, 2020, the entire contents of which are incorporated herein by reference.

BACKGROUND OF THE INVENTION

1. Field of the Invention

The present invention relates to an electronic circuit, a module, and a system.

2. Description of the Related Art

In the related art, in electronic keys used for key systems for vehicles, electronic keys communicate with the vehicles when batteries built into the electronic keys are connected to control circuits using the electric power obtained by the radio waves from the vehicles. Techniques for reducing the consumption of batteries in a standby state by cutting off the connection between batteries and circuits again if electronic keys are distant from vehicles (that is, during standby) are known (for example, refer to Patent Document 1)

PATENT DOCUMENTS

[Patent Document 1] Japanese Unexamined Patent Application, First Publication No. 2011-24332

SUMMARY OF THE INVENTION

In the related art as described above, an analog front-end circuit (AFE) inside an electronic key is started up using electric power obtained by radio waves from a vehicle. At this time, the AFE is started up using electric power obtained by radio waves from a specific apparatus provided in the vehicle or the like.

However, when the AFE is tried to be started up using radio waves from the vehicle, the electronic key has a problem that it takes time to store electric power required for starting up the AFE. That is to say, it is inconvenient to have to keep the electronic key close to a position in which the electronic key can receive radio waves from the vehicle until the electronic key is started up.

The present invention was made in view of such circumstances, and an object of the present invention is to provide a convenient electronic circuit in which a switch can be switched using electric power obtained by weak radio waves.

An electronic circuit according to an aspect of the present invention is an electronic circuit including: a switch connected between a power supply configured to output direct current (DC) electric power and a load driven by DC electric power supplied from the power supply and configured to switch a connection state between the power supply and the load to any of a conduction state in which electric power is supplied from the power supply to the load and a non-conduction state in which supply of electric power from the power supply to the load is cut off; a first antenna capable of receiving radio waves; a second antenna capable of receiving radio waves; a first power conversion circuit including a first power input terminal to which electric power obtained when the first antenna receives radio waves is input and a first DC power output terminal configured to output DC electric power and configured to convert electric power input to the first power input terminal into DC electric power and output the converted DC electric power from the first DC power output terminal; a second power conversion circuit including a second power input terminal to which electric power obtained when the second antenna receives radio waves is input and a second DC power output terminal configured to output DC electric power and configured to convert electric power input to the second power input terminal into DC electric power and output the converted DC electric power from the second DC power output terminal; and a control circuit including a first input terminal connected to the first DC power output terminal of the first power conversion circuit, a second input terminal connected to the second DC power output terminal of the second power conversion circuit, and an output terminal connected to the switch and configured to control a connection state of the switch, and configured to switch the connection state of the switch when a difference between electric power input from the first input terminal and electric power input from the second input terminal is larger than a predetermined value.

Also, in an electronic circuit according to another aspect of the present invention, the electronic circuit may further includes a power adjustment circuit configured to adjust a magnitude of electric power converted on the basis of radio waves received by an antenna on a high gain side when a gain of the first antenna is different from a gain of the second antenna, wherein the power adjustment circuit may adjust DC electric power output from the first DC power output terminal and DC electric power output from the second DC power output terminal so that the DC electric powers are made substantially the same.

In an electronic circuit according to another aspect of the present invention, the power adjustment circuit may be an attenuator configured to attenuate radio waves received by an antenna on a high gain side when a gain of the first antenna is different from a gain of the second antenna.

In an electronic circuit according to another aspect of the present invention, the power adjustment circuit may be a step-down circuit configured to step down a voltage of DC electric power converted on the basis of radio waves received by an antenna on a high gain side.

In an electronic circuit according to another aspect of the present invention, the first antenna and the second antenna may have substantially the same characteristics and gain.

In an electronic circuit according to another aspect of the present invention, the control circuit may switch the connection state of the switch to a conduction state when electric power input from the first input terminal is larger than electric power input from the second input terminal, and switch the connection state of the switch to a non-conduction state when electric power input from the first input terminal is smaller than electric power input from the second input terminal.

In an electronic circuit according to another aspect of the present invention, the control circuit may include a power detector.

In an electronic circuit according to another aspect of the present invention, the power detector may include: a current amplifier configured to amplify a current input to the second input terminal; a current adder configured to add a current input to the first input terminal to a current amplified by the current amplifier; and a comparator configured to output a voltage according to the result of comparing the current added by the current adder with a predetermined current to the output terminal.

In an electronic circuit according to another aspect of the present invention, the power detector may further include a gain switch configured to switch an amplification factor of the current amplifier in accordance with an output of the power detector.

In an electronic circuit according to another aspect of the present invention, the first antenna and the second antenna may be arranged apart at a predetermined distance from each other.

Also, a module according to another aspect of the present invention is a module including: the above-described electronic circuit; a power supply configured to output DC electric power; and a load driven by DC electric power supplied from the power supply.

A module according to another aspect of the present invention is accommodated in a housing having waterproofness.

Furthermore, a system according to another aspect of the present invention includes a module; and a transmitter configured to transmit prescribed radio waves to the module.

In addition, in the system according to another aspect of the present invention, when the radio waves are 2.4 GHz, a distance between the transmitter and the module in which the module can detect radio waves transmitted by the transmitter is within 2 centimeters.

According to the present invention, it is possible to provide a convenient electronic circuit in which a switch can be switched using electric power obtained by weak radio waves.

BRIEF DESCRIPTION OF THE DRAWINGS

FIGS. 23A and 23B are exemplary diagrams illustrating a constitution of the power detector having gain switching in the fourth embodiment.

DETAILED DESCRIPTION OF THE PREFERRED EMBODIMENTS

[Constitution of Latch System 100]

A constitution of a latch system 100 will be described below with reference to the drawings.

Figure 1:
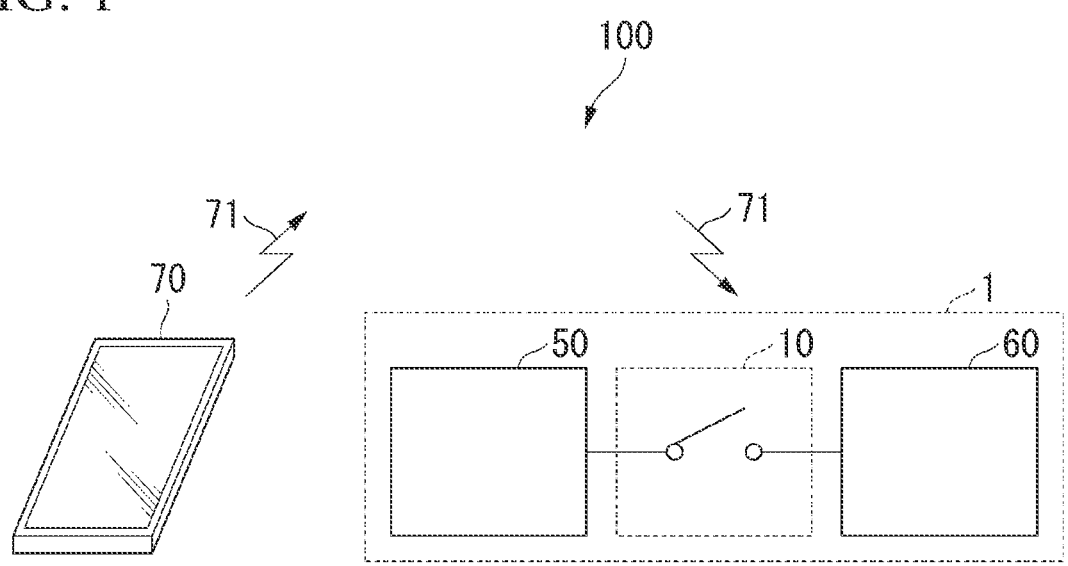
FIG. 1 is a diagram illustrating an example of a constitution of a latch system in an embodiment.

FIG. 1 is a diagram illustrating an example of the constitution of the latch system 100 in an embodiment. As illustrated in FIG. 1, the latch system 100 includes a transmitter 70 and a latch module 1.

The transmitter 70 is a terminal in which radio waves can be transmitted. Here, for example, the radio waves are radio waves transmitted by a transmission-side device during wireless communication performed in accordance with a communication standard such as Bluetooth (registered trademark) or Wi-Fi (registered trademark). The radio waves are not limited to a communication standard such as Bluetooth (registered trademark) or Wi-Fi (registered trademark), various communication methods can be adopted for the radio waves, and the radio waves may be transmitted through communication according to a unique standard in which the default communication standard is not satisfied.

For example, the transmitter 70 is a mobile information processing terminal in which wireless communication is possible such as multifunctional mobile phone terminals (smartphones), mobile phone terminals, personal digital assistants (PDAs), notebook PCs, and tablet PCs. The transmitter 70 is not limited to a mobile information processing terminal and may be another information processing terminal.

In this example, the transmitter 70 transmits radio waves 71.

The latch module 1 includes a power supply 50, a load 60, and a latch circuit 10. The latch module 1 receives the radio waves 71 transmitted from the transmitter 70.

The power supply 50 is a power supply configured to output direct current (DC) electric power. For example, the power supply 50 is a battery such as a lithium battery. When the latch module 1 is a small-sized device, the power supply 50 may be a battery as installed in a board. The power supply 50 supplies electric power to the load 60.

The load 60 has functions such as communication functions. For example, the load 60 may include a read only memory (ROM) (not shown), a random access memory (RAM) (not shown), and a central processing unit (CPU) (not shown).

The latch circuit 10 is connected between the power supply 50 and the load 60. The power supply 50 supplies electric power to the load 60 via the latch circuit 10.

The latch circuit 10 receives the radio waves 71 transmitted from the transmitter 70. The latch circuit 10 receives the radio waves 71 transmitted from the transmitter 70 to control a conduction state between the power supply 50 and the load 60. Hereinafter, the latch circuit 10 is also referred to as an "electronic circuit."

First Embodiment

A first embodiment of the present invention will be described below with reference to the drawings.

Figure 2:
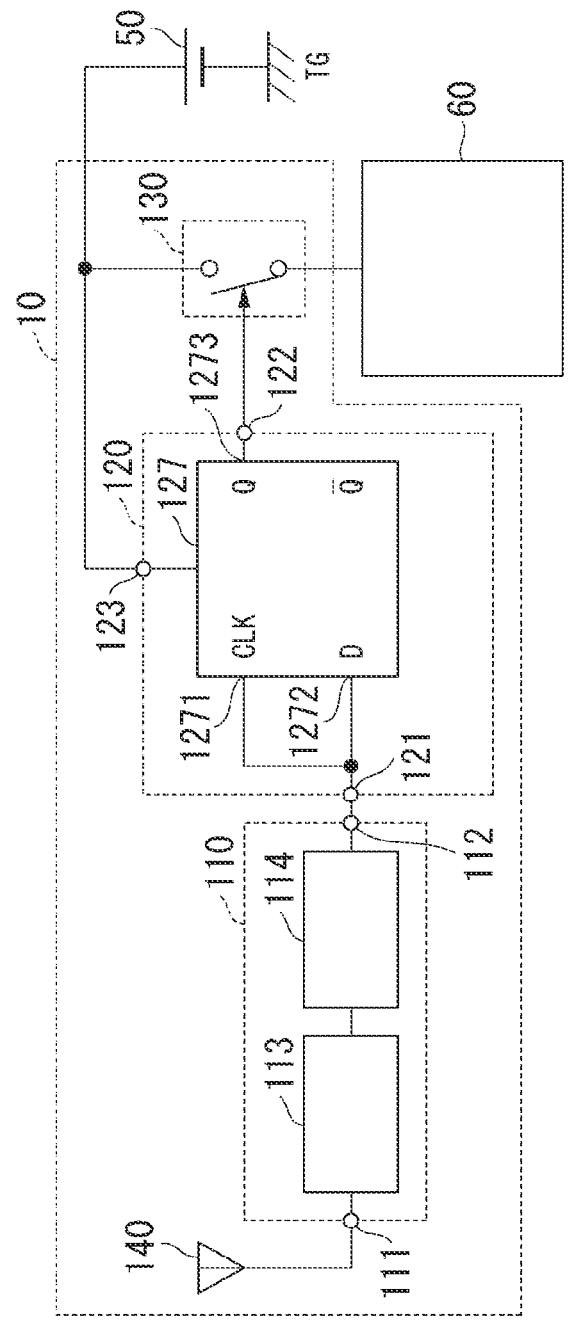
FIG. 2 is a diagram illustrating an example of a constitution of a latch module in a first embodiment.

FIG. 2 is a diagram illustrating an example of a constitution of the latch module 1 in the first embodiment. In FIG. 2, the latch module 1 includes a latch circuit 10, a power supply 50, and a load 60.

The latch circuit 10 includes an antenna 140, a power conversion circuit 110, a control circuit 120, and a switch 130.

The antenna 140 is connected to the power conversion circuit 110. The antenna 140 receives radio waves 71 transmitted from a transmitter 70.

The power conversion circuit 110 includes a power input terminal 111 as an input terminal and a DC power output terminal 112 as an output terminal. Radio waves received by the antenna 140 are input to the power input terminal 111. The electric power obtained by the radio waves received by the antenna 140 is converted to DC electric power and output. The DC power output terminal 112 outputs the DC electric power converted by the power conversion circuit 110. That is to say, the power conversion circuit 110 includes the power input terminal 111 to which the electric power obtained by the radio waves received by the antenna 140 capable of receiving radio waves is input and the DC power output terminal 112 configured to output DC electric power. Furthermore, the power conversion circuit 110 converts the electric power input to the power input terminal 111 into DC electric power and the converted DC electric power is output from the DC power output terminal 112.

The power conversion circuit 110 may include an RF-DC conversion circuit 113 and a booster circuit 114.

The RF-DC conversion circuit 113 converts the electric power obtained by the radio waves input to the power input terminal 111 into DC electric power. The RF-DC conversion circuit 113 outputs the converted DC electric power to the booster circuit 114.

The booster circuit 114 steps up a voltage of the DC electric power converted by the RF-DC conversion circuit 113. The booster circuit 114 outputs the stepped-up electric power via the DC power output terminal 112.

The control circuit 120 includes an input terminal 121 connected to the DC power output terminal 112 of the power conversion circuit 110 and an output terminal 122 connected to the switch 130 and configured to control a connection state of the switch 130. The control circuit 120 includes a power supply terminal 123 as a power supply terminal.

The DC electric power output by the power conversion circuit 110 is input to the input terminal 121. The output terminal 122 outputs an output signal corresponding to a state of the input terminal 121. Electric power is supplied from the power supply 50 to the power supply terminal 123.

The switch 130 is connected between the power supply 50 configured to output DC electric power and the load 60 driven by the DC electric power supplied from the power supply 50. The switch 130 switches a connection state between the power supply 50 and the load 60 from a non-conduction state to a conduction state.

The non-conduction state is a state in which the supply of electric power from the power supply 50 to the load 60 is cut off and the conduction state is a state in which electric power is supplied from the power supply 50 to the load 60.

In this example, the control circuit 120 includes a flip-flop 127. The flip-flop 127 switches a control signal output from the output terminal 122.

Although FIG. 2 illustrates an example in which a D flip-flop (a D-F/F) is utilized for the flip-flop 127, the D-F/F may be composed of another flip-flop such as a T type flip-flop.

The control circuit 120 controls a conduction state of the switch 130. To be specific, the control circuit 120 controls the connection state of the switch 130 to be in a conduction state when the power conversion circuit 110 outputs DC electric power due to the antenna 140 receiving the radio waves 71.

To be more specific, the input terminal 121 of the control circuit 120 is connected to a CLK terminal 1271 and a D terminal 1272 of the flip-flop 127. Furthermore, the output terminal 122 of the control circuit 120 is connected to a Q terminal 1273 of the flip-flop 127.

Since the input terminal 121 has a low level (the same potential as a ground potential) in a state in which the antenna 140 is not receiving the radio waves 71 (that is, in a state in which the transmitter 70 is distant from the latch circuit 10 or the radio waves 71 are not being transmitted from the transmitter 70), the Q terminal 1273 has the low level held therein. In this state, the switch 130 is controlled such that it is brought into a non-conduction state. That is to say, in this state, electric power is not supplied from the power supply 50 to the load 60.

The RF-DC conversion circuit 113 outputs DC electric power to the booster circuit 114 in a state in which the antenna 140 is receiving the radio waves 71 (that is, in a state in which the radio waves 71 are being transmitted from the transmitter 70 or the transmitter 70 is brought closer to the latch circuit 10). The booster circuit 114 performs stepping-up until the Q terminal 1273 of the flip-flop 127 has a changing threshold value potential or more. At this time, in the power conversion circuit 110, a potential sufficient to change a state of the Q terminal 1273 is input to the CLK terminal 1271 and the D terminal 1272 of the flip-flop 127. Thus, the level of the Q terminal 1273 is changed to a high level. In this state, the switch 130 is controlled to be in a conduction state.

If the switch 130 is controlled to be in a conduction state, the power supply 50 supplies electric power to the load 60 via the switch 130.

Since electric power is supplied from the power supply 50 to the flip-flop 127, even if the antenna 140 transitions to a state in which the antenna 140 does not receive the radio waves 71 (that is, a state in which the latch circuit 10 does not receive radio waves due to reasons such as the transmitter 70 moving to a position in which the transmitter is distance from the latch circuit 10), the Q terminal 1273 continues to output a high level.

In this embodiment, when the switch 130 is switched to be in a conduction state, the control circuit 120 keeps the switch 130 conductive using electric power supplied from the power supply 50 to the power supply terminal 123.

In this example, since the flip-flop 127 is connected to the power supply 50 via the power supply terminal 123, a constitution in which the flip-flop 127 with low power consumption is selected to significantly reduce an influence on a battery lifespan may be provided. For example, a flip-flop with low power consumption of less than 1 μA (microampere) may be selected.

Figure 3:
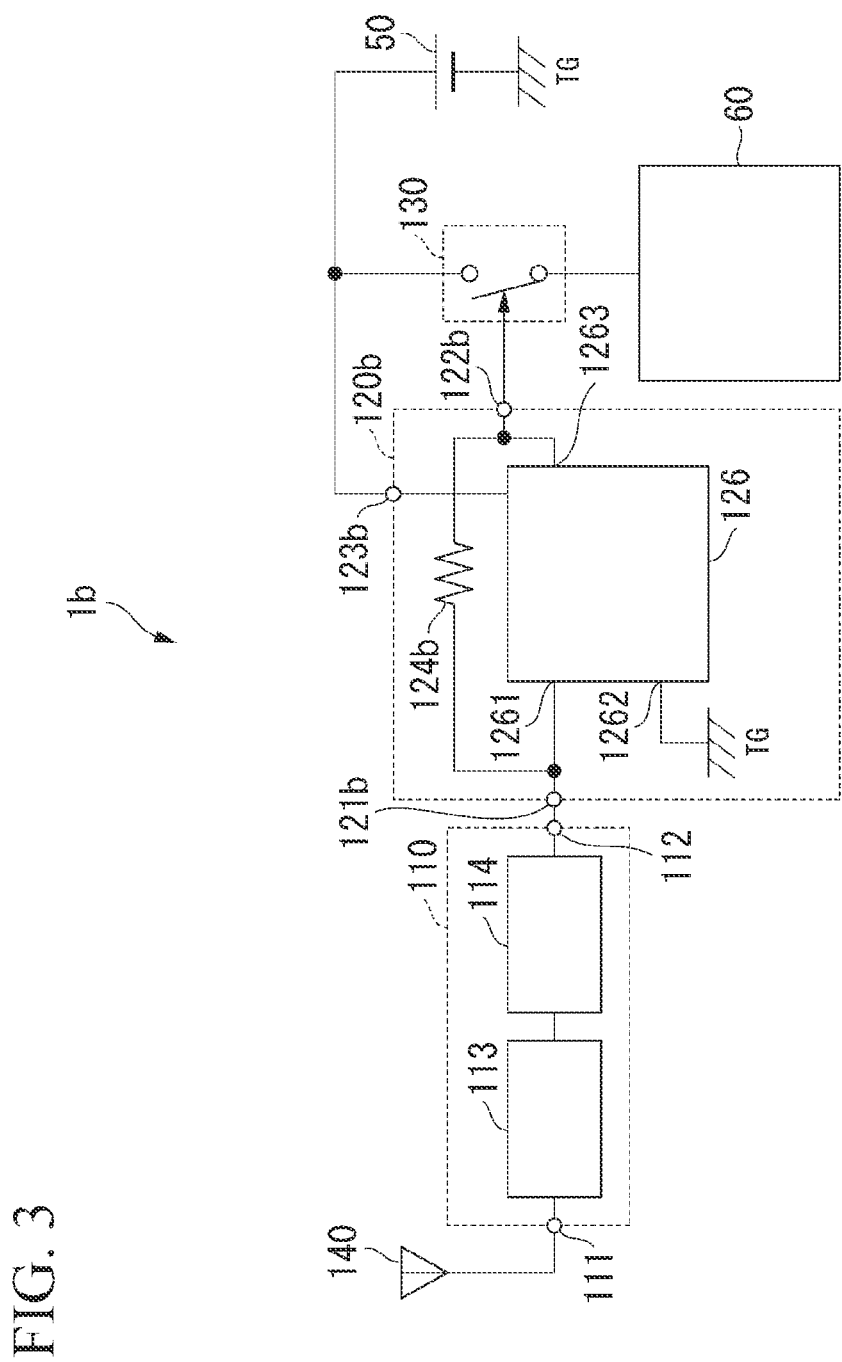
FIG. 3 is a diagram illustrating a first modified example of the constitution of the latch module in the first embodiment.

FIG. 3 is a diagram illustrating a first modified example of the constitution of the latch module 1 in the first embodiment. A latch module 1b illustrated in FIG. 3 is a first modified example of the latch module 1. A constituent element in the first modified example that is the same as the latch module 1 described above will be denoted by the same reference numeral and a description thereof will be omitted. The latch module 1b is different from the latch module 1 described above in that the latch module 1b includes a control circuit 120b instead of the control circuit 120.

The control circuit 120b includes an input terminal 121b connected to a DC power output terminal 112 of a power conversion circuit 110 and an output terminal 122b connected to a switch 130 and configured to control a connection state of the switch 130. Furthermore, the control circuit 120b includes a power supply terminal 123b as a power supply terminal.

DC electric power output by the power conversion circuit 110 is input to the input terminal 121b. The output terminal 122b outputs an output signal corresponding to a state of the input terminal 121b. Electric power is supplied from a power supply 50 to the power supply terminal 123b.

In this example, the control circuit 120b includes a power detector 126. The power detector 126 includes a detection input terminal 1261, a reference input terminal 1262, and a voltage detection output terminal 1263 as input/output terminals. The reference input terminal 1262 is connected to a ground point TG. The voltage detection output terminal 1263 outputs a potential corresponding to a potential of the detection input terminal 1261 and a potential of the reference input terminal 1262.

In a state in which an antenna 140 does not receive radio waves 71 (that is, in a state in which a transmitter 70 is distance from a latch circuit 10 or radio waves 71 is not transmitted from the transmitter 70), the input terminal 121b has a low level. Thus, the low level is input to the detection input terminal 1261. Since the reference input terminal 1262 is connected to the ground point TG (fixed to the low level), the voltage detection output terminal 1263 outputs the low level. In this state, the switch 130 is controlled to be in a non-conduction state.

In a state in which the antenna 140 is receiving radio waves 71 (that is, in a state in which radio waves 71 are being transmitted from the transmitter 70 or the transmitter 70 is brought closer to the latch circuit 10), an RF-DC conversion circuit 113 outputs DC electric power to a booster circuit 114. The booster circuit 114 steps up a potential of a power detector 126 to an operation potential (a high level) thereof. The power conversion circuit 110 outputs a high level. Since the high level is input to the detection input terminal 1261 of the power detector 126, the voltage detection output terminal 1263 outputs a high level. In this state, the switch 130 is controlled to be in a conduction state.

In this example, the detection input terminal 1261 of the power detector 126 is connected to the voltage detection output terminal 1263.

The control circuit 120b may include a resistor 124b. In this case, the detection input terminal 1261 of the power detector 126 is connected to the voltage detection output terminal 1263 via the resistor 124b. As an example, a resistance value of the resistor 124b may be 10 mega-ohms or more. When the control circuit 120b includes the resistor 124b, it is possible to further reduce power consumption.

When the power detector 126 outputs a high level to control the switch 130 to be in a conduction state and thus the power supply 50 is connected to a load 60, a current flowing through the control circuit 120b is only a current flowing through the resistor 124b and electric current consumption of the power detector 126, both of which are small.

In this way, since the power consumption of the power detector 126 is theoretically zero, the power consumption of the power supply 50 in which the switch 130 is in a non-conduction state can be changed to substantially zero. Therefore, in the example in which the power detector 126 is provided, it is possible to further reduce power consumption as compared with the example described above in which the flip-flop 127 is provided.

Figures 4A, 4B:
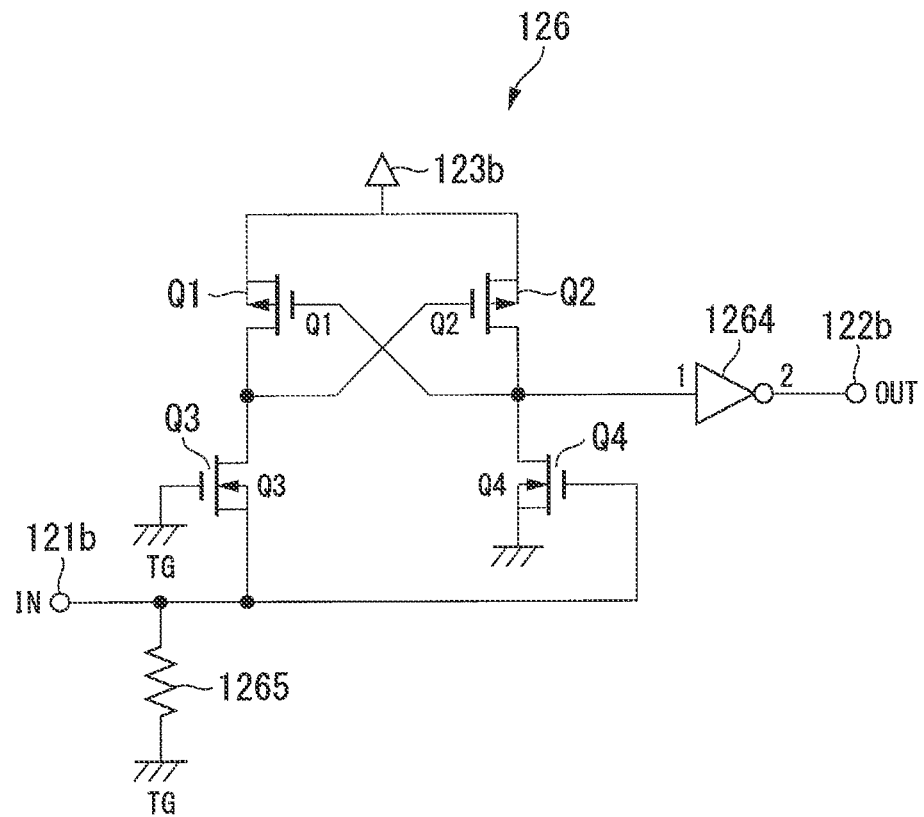
FIGS. 4A and 4B are exemplary diagrams illustrating a constitution of a control circuit in the first embodiment.

FIGS. 4A and 4B are exemplary diagrams illustrating a constitution of the power detector 126 in the first embodiment.

FIG. 4A is an example of the constitution of the power detector 126. In FIG. 4A, the power detector 126 includes a transistor Q1, a transistor Q2, a transistor Q3, a transistor Q4, an inverter 1264, and a resistor 1265.

The transistor Q1, the transistor Q2, and the transistor Q4 are enhancement type elements. The transistor Q3 is a depression type element.

When the output terminal 122b outputs a low level, the transistor Q2 and the transistor Q3 are turned on. When the output terminal 122b outputs a high level, the transistor Q1 and the transistor Q4 are turned on.

In this example, a current flows from the power supply terminal 123b to the ground point TG through two routes. A first route is a route in which a current flows from the power supply terminal 123b to the ground point TG via the transistor Q1 and the transistor Q3 and a second route is a route in which a current flows from the power supply terminal 123b to the ground point TG via the transistor Q2 and the transistor Q4. The power detector 126 cuts off both of the routes in which a current flows from the power supply terminal 123 to the ground point TG all the time, regardless of the state of the output terminal 122b.

Therefore, the power consumption of the power detector 126 is theoretically zero.

FIG. 4B is a truth value table in an example of the constitution of the power detector 126 illustrated in FIG. 4A. FIG. 4B illustrates a correspondence relationship between potentials of the input terminal 121b and the output terminal 122b and states of the transistor Q1, the transistor Q2, the transistor Q3, and the transistor Q4.

IN indicates a level of the potential of the input terminal 121b and OUT indicates a level of the potential of the output terminal 122b. The transistor Q1, the transistor Q2, the transistor Q3, and the transistor Q4 indicate states of the transistors.

Figure 5:
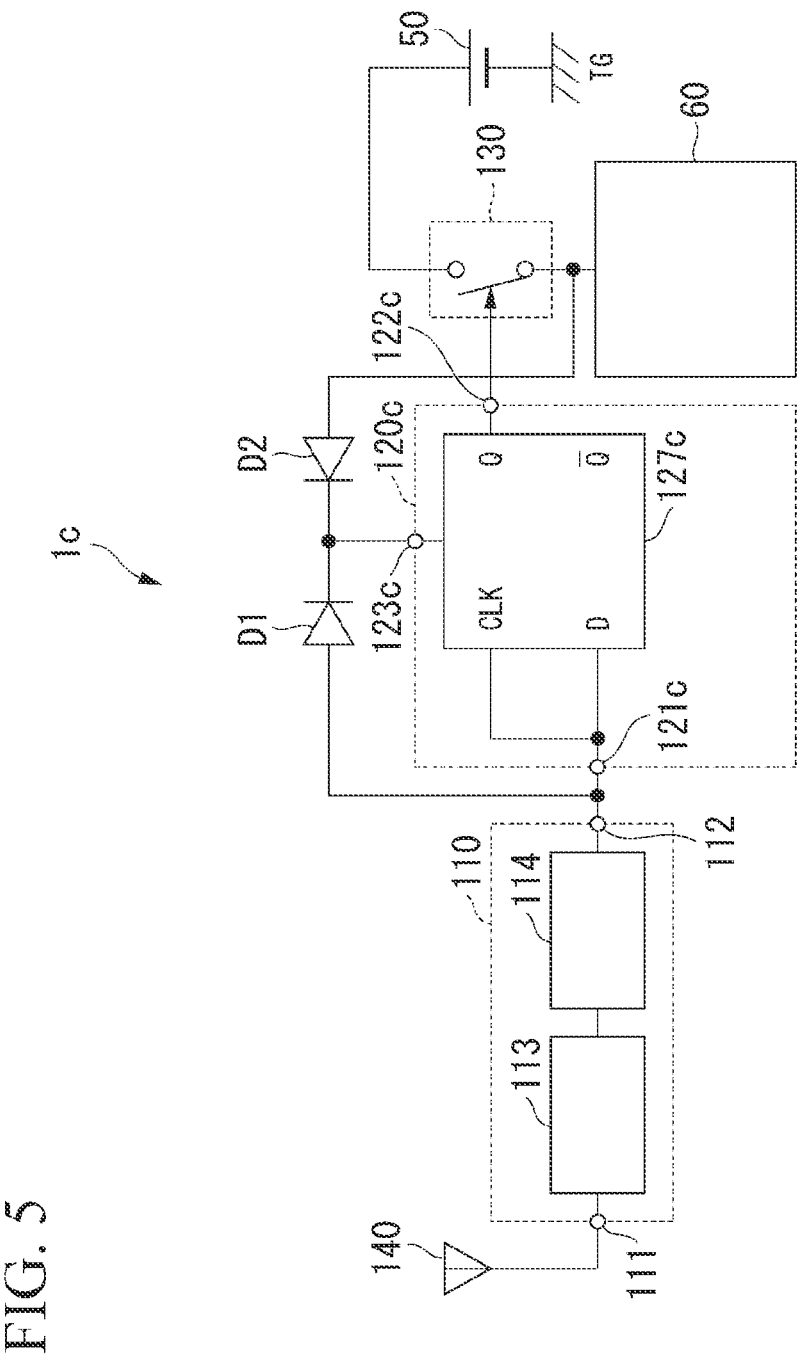
FIG. 5 is a diagram illustrating a second modified example of the constitution of the latch module in the first embodiment.

FIG. 5 is a diagram illustrating a second modified example of the constitution of the latch module 1 in the first embodiment. A latch module 1c illustrated in FIG. 5 is the second modified example of the latch module 1. A constituent element in the second modified example that is the same as the latch module 1 described above will be denoted by the same reference numeral and a description thereof will be omitted. The latch module 1c is different from that in a case in which a latch module 1a and a latch module 1b supply electric power to a power supply terminal 123c included in a control circuit 120c. The control circuit 120c is an example of the control circuit 120.

The control circuit 120c includes an input terminal 121c connected to a DC power output terminal 112 of a power conversion circuit 110 and an output terminal 122c connected to a switch 130 and configured to control a connection state of the switch 130. Furthermore, the control circuit 120c includes the power supply terminal 123c as a power supply terminal.

DC electric power output by the power conversion circuit 110 is input to the input terminal 121c. The output terminal 122c outputs an output signal corresponding to a state of the input terminal 121c. Electric power is supplied from at least one of the power conversion circuit 110 and the power supply 50 to the power supply terminal 123c.

In this example, the latch module 1c includes a diode D1 and a diode D2. The diode D1 has an anode connected to the DC power output terminal 112 of the power conversion circuit 110 and a cathode connected to the power supply terminal 123c of the control circuit 120c. The diode D2 has an anode connected to a connection point between the switch 130 and the load 60 and a cathode connected to the power supply terminal 123c of the control circuit 120c. Hereinafter, the diode D1 will be also referred to as a "first diode" and the diode D2 will be also referred to as a "second diode."

In a state in which the antenna 140 does not receive radio waves 71 (that is, in a state in which the transmitter 70 is distance from the latch circuit 10 or radio waves 71 are not transmitted from the transmitter 70), electric power is not supplied to the control circuit 120c. In this case, the switch 130 is controlled to be in a non-conduction state. The output terminal 122c may be fixed at a low level using a resistor (not shown) or the like.

In a state in which the antenna 140 is receiving radio waves 71 (that is, in a state in which radio waves 71 are being transmitted from the transmitter 70 or the transmitter 70 is brought closer to the latch circuit 10), an RF-DC conversion circuit 113 outputs DC electric power to the booster circuit 114. The booster circuit 114 steps up the DC electric power to a potential of a potential or more obtained by adding an amount corresponding to a stepped-down voltage of the diode D1 to an operation potential of the power detector 126. The power conversion circuit 110 supplies electric power from the DC power output terminal 112 to the power supply terminal 123c of the control circuit 120c via the diode D1.

In this case, a potential output from the DC power output terminal 112 of the power conversion circuit 110 is also input to the input terminal 121c of the control circuit 120c. If a high level is input to the input terminal 121c, the control circuit 120c outputs a high level to the output terminal 122c. Therefore, the switch 130 is controlled to be in a conduction state.

If the switch 130 is controlled to be in the conduction state, the power supply 50 supplies electric power to the power supply terminal 123c of the control circuit 120c via the switch 130 and the diode D2.

Even if the antenna 140 does not receive radio waves 71 (that is, a state in which the latch circuit 10 no longer receives radio waves due to reasons such as the transmitter 70 moving distance from the latch circuit 10) transitions, the control circuit 120c can receive the supply of electric power from the power supply 50 via the switch 130 and the diode D2.

Therefore, in this embodiment, in the switch 130, if the switch 130 is controlled to be in a conduction state when the antenna 140 receives the radio waves 71, the switch 130 is kept conductive.

Figure 6:
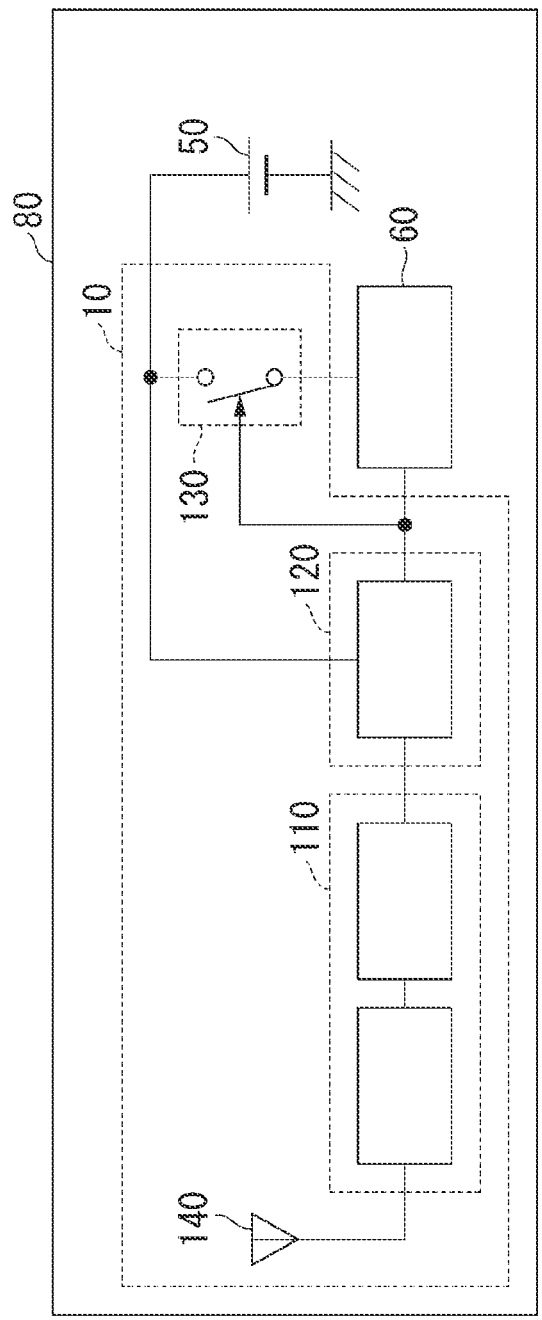
FIG. 6 is a diagram illustrating an example of a housing with a waterproof structure in the first embodiment.

FIG. 6 is a diagram illustrating an example of a housing with a waterproof structure in the first embodiment. As illustrated in FIG. 6, a latch waterproof module 2 includes the latch circuit 10, the power supply 50 configured to output DC electric power, the load 60 configured to be driven using DC electric power supplied from the power supply 50, and a housing 80.

The housing 80 includes the latch circuit 10, the power supply 50, and the load 60 accommodated therein. The housing 80 is waterproof.

[Summary of Effects of the First Embodiment]

According to the embodiment described above, the latch circuit 10 controls a connection state between the power supply 50 and the load 60 to be in a conduction state using the radio waves received by the antenna 140.

In the related art, in the small-sized device as shipped with the battery installed in the board, electric power is supplied the moment the battery is installed, and the consumption of the battery begins. Although it is desirable that electric power be supplied only after the device is delivered to a customer or when a customer intends to supply electric power in view of a battery lifespan, contact type switches, (removable) insulating films, and the like lead to an increase in size of the small-sized device.

The latch circuit 10 can prevent increase in size of the small-sized device by controlling a connection state between the power supply 50 and the load 60 to be in a conduction state using the radio waves received by the antenna 140.

Also, according to the above-described embodiment, in the latch circuit 10, the power conversion circuit 110 converts the electric power obtained using the radio waves received by the antenna 140 into DC electric power and the control circuit 120 controls a conduction state of the switch 130. Since the latch circuit 10 can switch a state of the switch 130 to be in a conduction state even using weak radio waves when including the control circuit 120, it does not take time to start up the AFE which is a load. Thus, it is possible to provide the latch module 1 in which it does not take time from the reception of radio waves to the starting-up of the load 60.

Therefore, it is possible to provide the convenient latch circuit 10.

Also, according to the above-described embodiment, the control circuit 120 included in the latch circuit 10 receives electric power supplied from the power supply 50. Therefore, after the antenna 140 receives radio waves, the latch circuit 10 can keep the connection state of the switch 130 conductive even in a state in which the antenna 140 does not receive radio waves.

Furthermore, according to the above-described embodiment, the control circuit 120 includes the flip-flop 127. Therefore, the control circuit 120 can switch and keep the connection state of the switch 130 using a simple constitution.

Also, according to the above-described embodiment, the control circuit 120 includes the power detector 126 having feedback.

Since the output signal of the control circuit 120 is fed back to the input, the control circuit 120 can maintain the connection state of the switch 130. Furthermore, it is possible to maintain the state of the switch 130 with low power consumption.

Furthermore, according to the above-described embodiment, the power detector 126 further includes the resistor 124b in which 10 mega-ohms or more is provided. Therefore, when the control circuit 120 includes the resistor 124b, it is possible to further reduce electric power consumed by the control circuit 120.

In addition, according to the above-described embodiment, when the latch module 1 includes the diode D1, the power conversion circuit 110 provides electric power of the control circuit 120. Therefore, the latch module 1 can obtain electric power for switching the switch 130 to a conduction state from radio waves received by the antenna 140. That is to say, the latch module 1 can switch the switch 130 to a conduction state without consuming electric power of the power supply 50.

Moreover, according to the above-described embodiment, when the latch module 1 includes the diode D2, after the switch 130 is controlled to be in a conduction state, it is possible to receive the supply of electric power from the power supply 50. Therefore, the switch 130 can maintain the conduction state.

In addition, according to the above-described embodiment, the latch module 1 is accommodated in the housing 80 with waterproofness. For example, when the starting-up of the system is required in a non-contact state in a device used in a sealed state in water, it is possible to start up the system in a non-contact state by applying the latch module 1 in this embodiment.

Examples of the device used in a sealed state in water a water quality measurement device, a small-sized camera device, and the like. Furthermore, the expression "in water" includes not only water but also a wide range of liquids such as electrolytic solutions and body fluids.

Second Embodiment

A second embodiment of the present invention will be described below with reference to the drawings.

Figure 7:
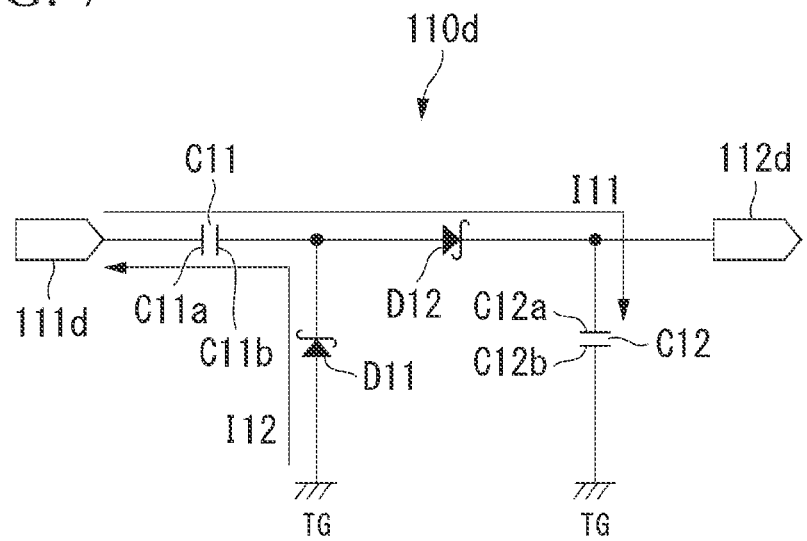
FIG. 7 is a diagram illustrating an example of a power conversion circuit in a second embodiment.

FIG. 7 is a diagram illustrating an example of a power conversion circuit 110d in the second embodiment. The power conversion circuit 110d is an example of the power conversion circuit 110.

In FIG. 7, the power conversion circuit 110d includes a first capacitor C11, a first diode D11, a second diode D12, and a second capacitor C12.

The first capacitor C11 includes a first electrode C11a and a second terminal C11b. The first electrode C11a of the first capacitor C11 is connected to a power input terminal 111a and a second electrode C11b is connected to a connection point between a cathode of the first diode D11 and an anode of the second diode D12.

The first diode D11 has an anode connected to a ground point TG and the cathode connected to the second electrode C11b of the first capacitor C11.

The second capacitor C12 includes a first electrode C12a and a second electrode C12b. The first electrode C12a of the second capacitor C12 is connected to the DC power output terminal 112d and the second electrode C12b is connected to the ground point TG.

The second diode D12 has an anode connected to a power input terminal 111d via a capacitor. In the case of this example, the anode of the second diode D12 is connected to the power input terminal 111d via the first capacitor C11. Furthermore, the second diode D12 has a cathode connected to the first electrode C12a of the second capacitor C12.

If a positive potential is applied to the power input terminal 111d, a current I11 flows from the power input terminal 111d via the first capacitor C11 and the second diode D12. Electric charge is accumulated in the second capacitor C12 through the current I11.

If a negative potential is applied to the power input terminal 111d, a current I12 flows from the ground point TG via the first diode D11 and the first capacitor C11. Electric charge is accumulated in the first capacitor C11 through the current I12.

When a positive potential is applied to the power input terminal 111d again, a current I11 flows from the power input terminal 111d via the first capacitor C11 and the second diode D12. As a result, a potential twice that of the power input terminal 111d is output to the DC power output terminal 112d. This is an operation of a half-wave voltage doubler rectifier circuit.

The power conversion circuit 110d is a voltage doubler rectifier circuit configured to step up weak radio waves. The weak radio waves use, for example, a 2.4 GHz band such as a Bluetooth (registered trademark) low Energy (LE) (hereinafter referred to as a "BLE") standard communication method installed in a smartphone or the like. It is desirable that the first diode D11 and the second diode D12 (hereinafter, when diodes provided in the power conversion circuit 110 are not distinguished, they are referred to as a "diode D") have excellent high frequency characteristics, a low forward voltage, and a small capacitance between terminals. In this example, the diode D may be a Schottky barrier diode.

In the first capacitor C11 and the second capacitor C12 (hereinafter, when capacitors provided in the power conversion circuit 110 are not distinguished, they are referred to as a "capacitor C"), a response rate and an arrival voltage value of a stepped-up voltage change in accordance with a capacitance. Furthermore, if the capacitor C does not have a sufficient capacitance value, an amount of ripple (an amount of voltage fluctuation) of an output voltage increases and DC characteristics deteriorate. On the other hand, if the capacitor C has a too large capacitance value, it takes time to charge and responsiveness deteriorates.

Therefore, the capacitance value of the capacitor C is adjusted to a value at which well-balanced and good voltage doubler characteristics can be obtained for each application of the selected diode D and latch circuit 10. For example, in this embodiment, 33 pF, 24 pF, and the like are preferable at 2.4 GHz.

An optimum capacitance value changes depending on a stray capacitance, a board pattern, an installation layout, and the like of a board. In the circuit illustrated in FIG. 7, an optimum value changes in the range of several to several tens of pF. An optimum capacitance value needs to be confirmed in accordance with a stray capacitance, a board pattern, an installation layout, and the like of a board.

When the power conversion circuit 110 has a constitution in which the above-described voltage doubler rectifier circuit is incorporated in multiple stages, it is possible to obtain a potential at which the control circuit 120 can operate even with weaker radio waves.

Figure 8:
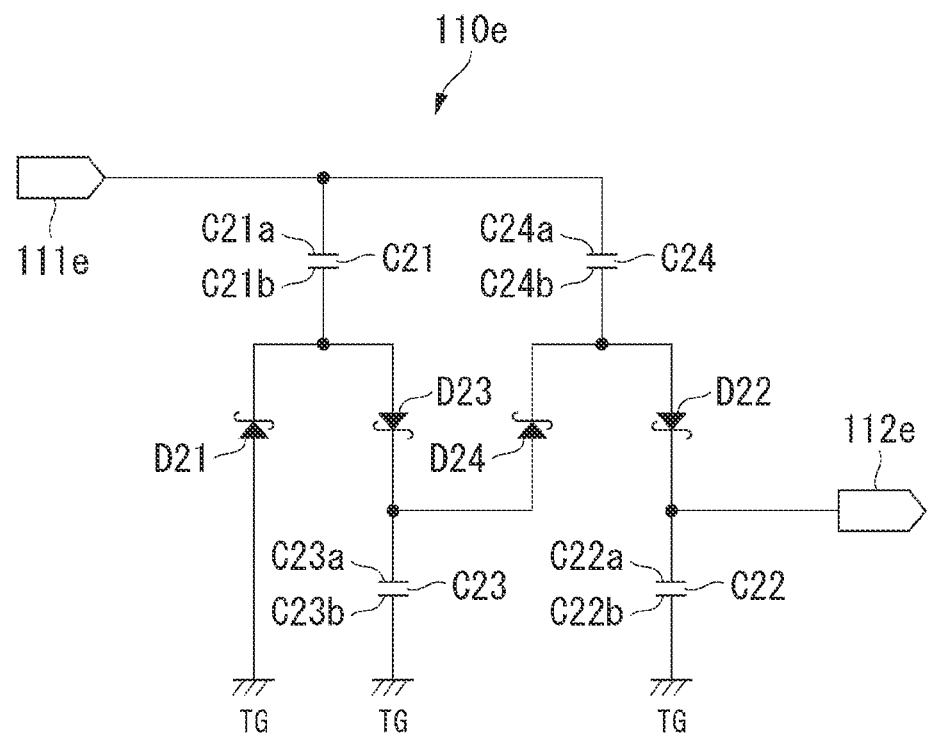
FIG. 8 is a diagram illustrating a first modified example of the power conversion circuit in the second embodiment.

FIG. 8 is a diagram illustrating the power conversion circuit 110e which is a first modified example of the power conversion circuit 110 in the second embodiment. The power conversion circuit 110e is an example of the power conversion circuit 110 described above. A constituent element in the first modified example that is the same as the power conversion circuit 110 described above will be denoted by the same reference numeral and a description thereof will be omitted.

In FIG. 8, the power conversion circuit 110e includes a first capacitor C21, a first diode D21, a second capacitor C22, a second diode D22, a third capacitor C23, a third diode D23, a fourth capacitor C24, and a fourth diode D24.

In this example, the first capacitor C21, the first diode D21, the second capacitor C22, and the second diode D22 are the same as the first capacitor C11, the first diode D11, the second capacitor C12, and the second diode D12, respectively.

When the power conversion circuit 110e further includes the third capacitor C23, the third diode D23, the fourth capacitor C24, and the fourth diode D24 as compared with the power conversion circuit 110d, a two-stage voltage doubler rectifier circuit is constituted.

The third capacitor C23 includes a first electrode C23a and a second electrode C23b. The first electrode C23a of the third capacitor C23 is connected to a cathode of the third diode D23 and the second electrode C23b is connected to a ground point TG.

The third diode D23 has an anode connected to a second electrode C21b of the first capacitor C21 and the cathode connected to the first electrode C23a of the third capacitor C23.

The fourth capacitor C24 includes a first electrode C24a and a second electrode C24b. The first electrode C24a of the fourth capacitor C24 is connected to a power input terminal 111e and the second electrode C24b is connected to a cathode of the fourth diode D24.

The fourth diode D24 has an anode connected to a connection point between the cathode of the third diode D23 and the first electrode C23a of the third capacitor C23 and the cathode connected to the second electrode C24b of the fourth capacitor C24.

Also, in the case of this example, the anode of the second diode D22 is connected to the power input terminal 111e via the fourth capacitor C24.

In the example illustrated in FIG. 8, a voltage four times an input voltage input to the power input terminal 111e can be output from the DC power output terminal 112e.

When the multi-stage voltage doubler rectifier circuit is constituted in this way, the power conversion circuit 110 can obtain a potential at which the control circuit 120 can operate.

Here, when the multi-stage voltage doubler rectifier circuit is constituted, it causes a decrease in RF-DC conversion efficiency. Furthermore, the manufacturing cost increases due to an increase in the number of parts constituting the multi-stage voltage doubler rectifier circuit. Therefore, it is desirable to set the number of stages appropriate for each application.

Figure 9:
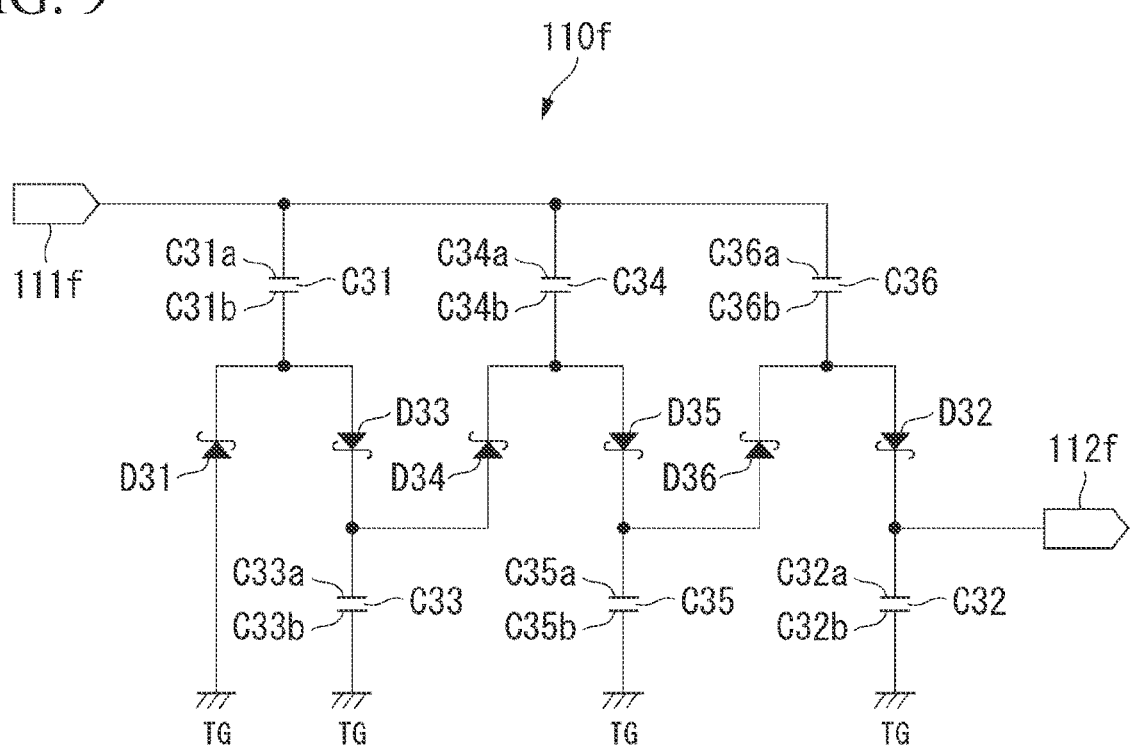
FIG. 9 is a diagram illustrating a second modified example of the power conversion circuit in the second embodiment.

FIG. 9 is a diagram illustrating a power conversion circuit 110f which is a second modified example of the power conversion circuit 110 in the second embodiment. The power conversion circuit 110f is an example of the power conversion circuit 110 described above. A constituent element in the second modified example that is the same as the power conversion circuit 110 described above will be described by the same reference numeral and a description thereof will be omitted.

In FIG. 9, the power conversion circuit 110f includes a first capacitor C31, a first diode D31, a second capacitor C32, a second diode D32, a third capacitor C33, a third diode D33, a fourth capacitor C34, a fourth diode D34, a fifth capacitor C35, a fifth diode D35, a sixth capacitor C36, and a sixth capacitor C36.

In this example, the first capacitor C31, the first diode D31, the second capacitor C32, the second diode D32, the third capacitor C33, the third diode D33, the fourth capacitor C34, and the fourth diode D34 are the same as the first capacitor C21, the first diode D21, the second capacitor C22, the second diode D22, the third capacitor C23, the first diode D23, the fourth capacitor C24, and the fourth diode D24, respectively.

The power conversion circuit 110f further includes a fifth capacitor C35, a fifth diode D35, a sixth capacitor C36, and a sixth diode D36 compared with the power conversion circuit 110e to constitute a three-stage voltage doubler rectifier circuit.

The fifth capacitor C35 includes a first electrode C35a and a second electrode C35b. The first electrode C35a of the fifth capacitor C35 is connected to a cathode of the fifth diode D35 and the second electrode C35b is connected to the ground point TG.

The fifth diode D35 has an anode connected to a second electrode C34b of the fourth capacitor C34 and the cathode connected to the first electrode C35a of the fifth capacitor C35.

The sixth capacitor C36 includes a first electrode C36a and a second electrode C36b. The first electrode C36a of the sixth capacitor C36 is connected to a power input terminal 111f and the second electrode C36b is connected to a cathode of the sixth diode D36.

The sixth diode D36 has an anode connected to a connection point between the cathode of the fifth diode D35 and the first electrode C35a of the fifth capacitor C35 and the cathode connected to the second electrode C36b of the sixth capacitor C36.

Also, in the case of this example, the anode of the second diode D32 is connected to the power input terminal 111f via the sixth capacitor C36.

In the example illustrated in FIG. 9, a voltage which is six times an input voltage input to the power input terminal 111f can be output from the DC power output terminal 112f.

When the multi-stage voltage doubler rectifier circuit is constituted in this way, the power conversion circuit 110 can obtain a potential at which the control circuit 120 can operate. In the example associated with the power conversion circuit 110f, the control circuit 120 can be operated by weaker radio waves as compared with the example associated with the power conversion circuit 110e.

[Summary of Effects of Second Embodiment]

According to the embodiment described above, the latch circuit 10 illustrated in FIG. 1 constitutes the power conversion circuit 110 using the voltage doubler rectifier circuit. When the latch circuit 10 constitutes the power conversion circuit 110 using the voltage doubler rectifier circuit, it is possible to generate DC electric power stepped-up from that of weak radio waves. The power conversion circuit 110 can drive the control circuit 120 by supplying the stepped-up DC electric power to the control circuit 120.

Also, according to the above-described embodiment, the voltage doubler rectifier circuit is constituted of the capacitor C and the diode D. Therefore, the latch circuit 10 can constitutes the power conversion circuit 110 with a simple constitution.

Furthermore, according to the above-described embodiment, the latch circuit 10 constitutes the power conversion circuit 110 using the two-stage voltage doubler rectifier circuit. When the latch circuit 10 constitutes the power conversion circuit 110 using the two-stage voltage doubler rectifier circuit, it is possible to drive the control circuit 120 even with weak radio waves. When the latch circuit 10 drives the control circuit 120 even with weak radio waves, it is possible to control the power supply 50 and the load 60 to be in a conduction state.

In addition, according to the above-described embodiment, the latch circuit 10 constitutes the power conversion circuit 110 using the three-stage voltage doubler rectifier circuit. When the latch circuit 10 constitutes the power conversion circuit 110 using the three-stage voltage doubler rectifier circuit, it is possible to drive the control circuit 120 even with weaker radio waves compared with the two-stage voltage doubler rectifier circuit. The latch circuit 10 can control the power supply 50 and the load 60 to be in a conduction state by driving the control circuit 120 even with weaker radio waves.

Third Embodiment

A third embodiment of the present invention will be described below with reference to the drawings.

Figure 10A:
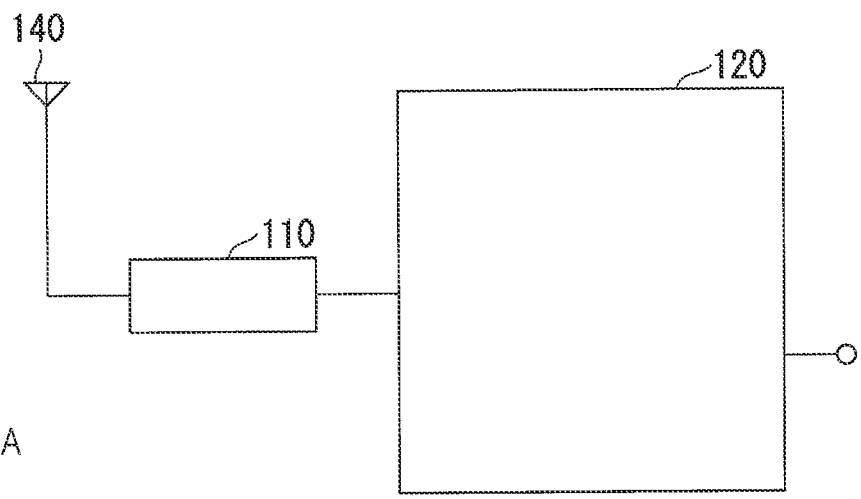
FIGS. 10A and 10B exemplary diagrams illustrating a first antenna and a second antenna in a third embodiment.
Figure 10B:
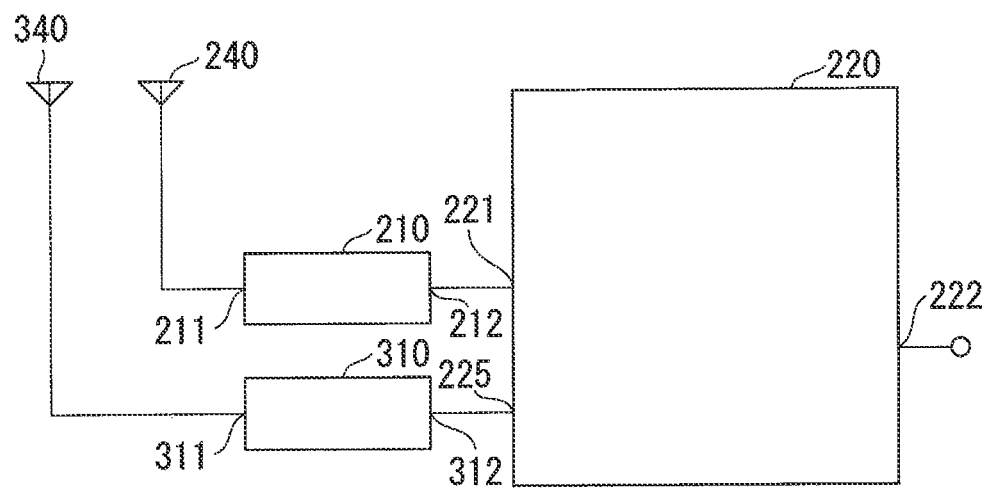

FIGS. 10A and 10B are exemplary diagrams illustrating a first antenna 240 and a second antenna 340 in a third embodiment. FIG. 10A is a diagram illustrating an example of a constitution of a case in which the latch module 1 described above includes one antenna 140. In this case, the radio waves received by the antenna 140 are converted into DC electric power by the power conversion circuit 110 and input to the control circuit 120.

The control circuit 120 controls the switch 130 from a non-conduction state to a conduction state. In the case of this example, the control circuit 120 cannot control the switch 130 from a conduction state to a non-conduction state.

FIG. 10B is a diagram illustrating an example of a constitution in a case in which the latch module 1 includes two antennas (a first antenna 240 and a second antenna 340). In this case, the latch module 1 includes the first antenna 240, a first power conversion circuit 210, the second antenna 340, a second power conversion circuit 310, and a control circuit 220.

In this example, the first antenna 240 and the second antenna 340 may be provided at different angles from each other.

The first antenna 240 is provided to be able to receive first radio waves in a first direction.

The first power conversion circuit 210 includes a first power input terminal 211 and a first DC power output terminal 212. The first power input terminal 211 is connected to the first antenna 240. The first DC power output terminal 212 is connected to the control circuit 220.

The electric power obtained using the first radio waves received by the first antenna 240 is input to the first power input terminal 211. If the electric power is input to the first power input terminal 211, the first power conversion circuit 210 converts the electric power input to the first power input terminal 211 into DC electric power. The first power conversion circuit 210 outputs DC electric power from the first DC power output terminal 212.

The second antenna 340 is provided to be able to receive second radio waves in a second direction different from the first direction.

The second power conversion circuit 310 includes a second power input terminal 311 and a second DC power output terminal 312. The second power input terminal 311 is connected to the second antenna 340. The second DC power output terminal 312 is connected to the control circuit 220.

The electric power obtained using the second radio waves received by the second antenna 340 is input to the second power input terminal 311. If the electric power is input to the second power input terminal 311, the second power conversion circuit 310 converts the electric power input to the second power input terminal 311 into DC electric power. The second power conversion circuit 310 outputs DC electric power from the second DC power output terminal 312.

The control circuit 220 includes, as input/output terminals, a first input terminal 221, a second input terminal 225, and an output terminal 222.

The first input terminal 221 is connected to the first DC power output terminal 212 of the first power conversion circuit 210. The second input terminal 225 is connected to the second DC power output terminal 312 of the second power conversion circuit 310. The output terminal 222 is connected to the switch 130 and controls the connection state of the switch 130.

The control circuit 220 controls the connection state of the switch 130 to be in a conduction state when the first power conversion circuit 210 outputs DC electric power due to the reception of the first radio waves by the first antenna 240. The control circuit 220 controls the connection state of the switch 130 to be in a non-conduction state when the second power conversion circuit 310 outputs DC electric power due to the reception of the second radio waves by the second antenna 340.

In this way, in the example illustrated in FIG. 10B, the control circuit 220 can not only control the switch 130 from a non-conduction state to a conduction state, but also control the switch 130 from a conduction state to a non-conduction state.

Figure 11A:
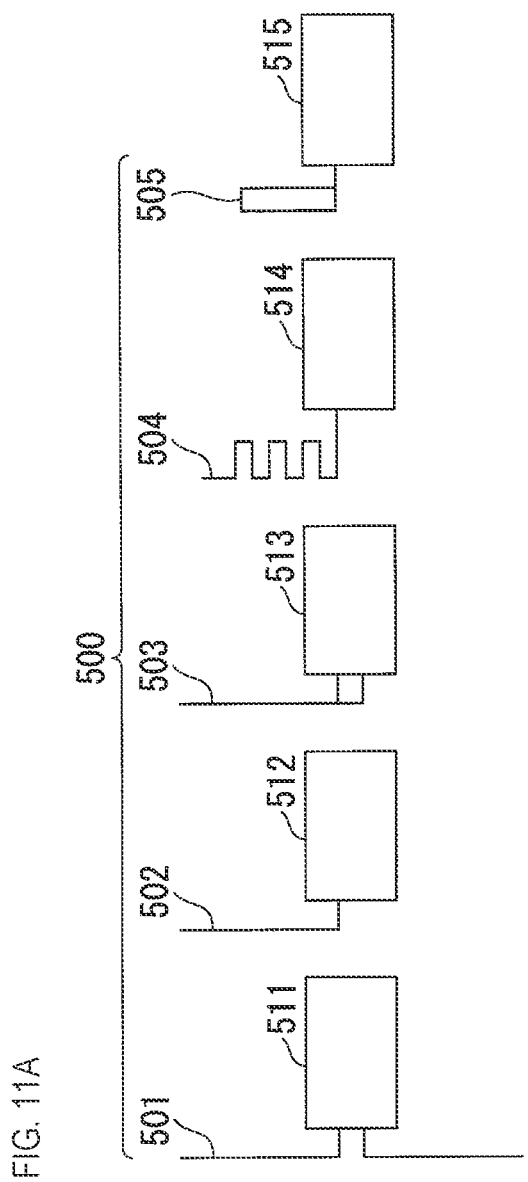
FIGS. 11A and 11B are exemplary diagrams illustrating the first antenna and the second antenna in a third embodiment.
Figure 11B:
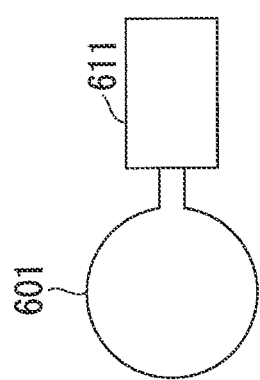

FIGS. 11A and 11B are exemplary diagrams illustrating the first antenna 240 and the second antenna 340 in the third embodiment.

FIG. 1A is a diagram illustrating an example of an electric field type antenna 500 in the third embodiment. FIG. 11A illustrates an example of a type of antenna when the first antenna 240 or the second antenna 340 is the electric field type antenna 500.

When the first antenna 240 or the second antenna 340 is the electric field type antenna 500, the first antenna 240 or the second antenna 340 may be a dipole antenna 501, a monopole antenna 502, an inverted F antenna 503, a meander line antenna 504, or a chip antenna 505.

FIG. 11B is a diagram illustrating an example of a magnetic field type antenna 600 in the third embodiment. FIG. 11B illustrates an example of a type of antenna when the first antenna 240 or the second antenna 340 is the magnetic field type antenna 600.

When the first antenna 240 or the second antenna 340 is the magnetic field type antenna 600, the first antenna 240 or the second antenna 340 may be a loop antenna 601.

The types of antennas of the first antenna 240 and the second antenna 340 in this embodiment are not limited to the types of antennas illustrated in FIGS. 11A and 11B. In addition, various antennas can be selected as the first antenna 240 and the second antenna 340.

Figure 12:
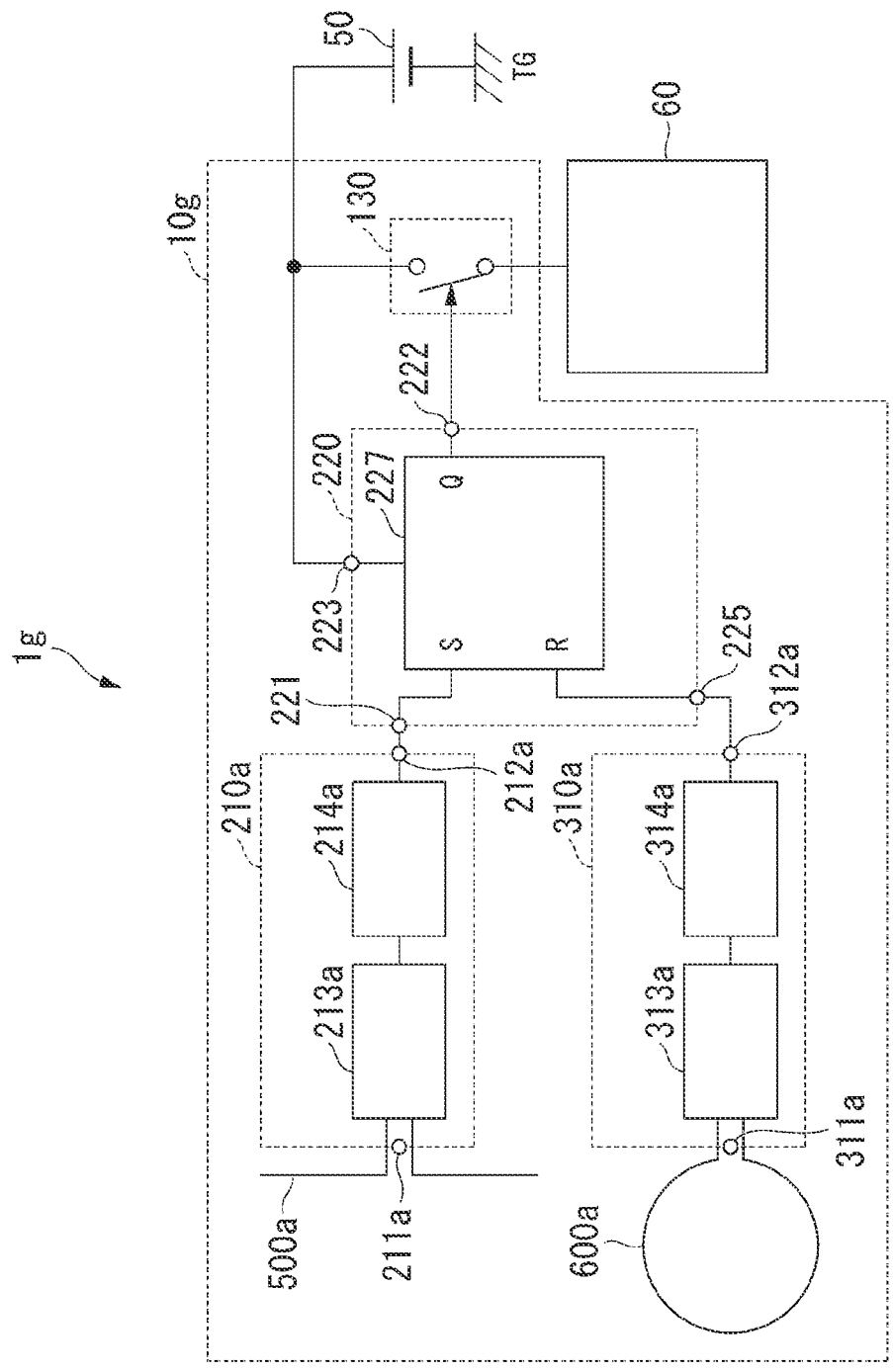
FIG. 12 is a diagram illustrating an example of a constitution of a latch module in the third embodiment.

FIG. 12 is a diagram illustrating an example of a constitution of a latch module 1g in the third embodiment. The latch module 1g illustrated in FIG. 6 is a modified example of the latch module 1 in the first embodiment. A constituent element in this example that is the same as the latch module 1 described above will be denoted by the same reference numeral and a description thereof will be omitted.

In FIG. 6, the latch module 1g includes a latch circuit 10g, a power supply 50, and a load 60.

The latch circuit 10g includes an electric field type antenna 500a, a magnetic field type antenna 600a, a first power conversion circuit 210a, a second power conversion circuit 310a, a control circuit 220, and a switch 130. The electric field type antenna 500a is an example of a first antenna 240 and the magnetic field type antenna 600a is an example of a second antenna 340.

The first power conversion circuit 210a may include an RF-DC conversion circuit 213a and a booster circuit 214a and the second power conversion circuit 310a may include an RF-DC conversion circuit 313a and a booster circuit 314a.

The electric field type antenna 500a receives first radio waves in a first direction. The electric power when the electric field type antenna 500a receives the first radio waves is input to the first power input terminal 211a of the first power conversion circuit 210a. The first power conversion circuit 210a converts the input electric power into DC electric power and outputs the converted DC electric power to the first DC power output terminal 212a.

In this case, since the magnetic field type antenna 600a is installed to be able to receive second radio waves in a second direction different from the first direction, the magnetic field type antenna 600a does not receive the first radio waves. Therefore, DC electric power is input to only the first input terminal 221 of the control circuit 220.

The magnetic field type antenna 600a receives the second radio waves in the second direction. Electric power when the magnetic field type antenna 600a receives the second radio waves is input to the second power input terminal 311a of the second power conversion circuit 310a. The second power conversion circuit 310a converts the input electric power into DC electric power and outputs the converted DC electric power to the second DC power output terminal 312a.

In this case, since the electric field type antenna 500a is installed to be able to receive the first radio waves in the first direction different from the second direction, the electric field type antenna 500a does not receive the second radio waves. Therefore, DC electric power is input to only the second input terminal 225 of the control circuit 220.

In this example, the control circuit 220 includes a flip-flop 227. The flip-flop 227 switches a control signal outputs from the output terminal 222 on the basis of a potential of the first input terminal 221 and a potential of the second input terminal 225.

To be specific, the flip-flop 227 is an SR flip-flop (SR-F/F). To be more specific, the first input terminal 221 is connected to an S terminal of the flip-flop 227, the second input terminal 225 is connected to an R terminal of the flip-flop 227, and the output terminal 222 is connected to a Q terminal.

In a state in which the electric field type antenna 500a receives the first radio waves, the first power conversion circuit 210a outputs DC electric power. The output DC electric power is input to the S terminal in which a potential according to the DC electric power corresponds to that of the first input terminal 221 of the flip-flop 227. When the input potential exceeds a threshold value voltage in which a state of the flip-flop 227 is caused to be changed, that is, if a high level is input to the S terminal of the flip-flop 227, the Q terminal of the flip-flop 227 outputs a high level. In this state, the switch 130 is controlled to be in a conduction state. If the switch 130 is controlled to be in the conduction state, the power supply 50 supplies electric power to the load 60.

In a state in which the magnetic field type antenna 600a receives the second radio waves, the second power conversion circuit 310a outputs DC electric power. The output DC electric power is input to the R terminal in which a potential according to the DC electric power corresponds to that of the second input terminal 225 of the flip-flop 227. When the input potential exceeds a threshold value voltage in which a state of the flip-flop 227 is caused to be changed, that is, if a high level is input to the R terminal of the flip-flop 227, the Q terminal of the flip-flop 227 outputs a low level. In this state, the switch 130 is controlled to be in a non-conduction state.

Electric power is supplied from the power supply 50 to the control circuit 220 including the flip-flop 227. Therefore, in a state in which both of the electric field type antenna 500a and the magnetic field type antenna 600a do not receive radio waves, the flip-flop 227 continues to keep an output state of the Q terminal. That is to say, a connection state of the switch 130 differs depending on whether it is controlled to be in a conduction state or in a non-conduction state in accordance with whether the electric field type antenna 500a or the magnetic field type antenna 600a finally receives radio waves. If the switch 130 is controlled to be in the non-conduction state, the power supply 50 stops the supply of electric power to the load 60.

In this example, since the flip-flop 227 is connected to the power supply 50 via a power supply terminal 223, a constitution in which the flip-flop 227 with low power consumption is selected to significantly reduce an influence on a battery lifespan may be provided. For example, a flip-flop with low power consumption of less than 1 μA (microampere) may be selected.

Also, the control circuit 220 may be composed of a low power consumption latch circuit having a function equivalent to that of a flip-flop.

Figure 13:
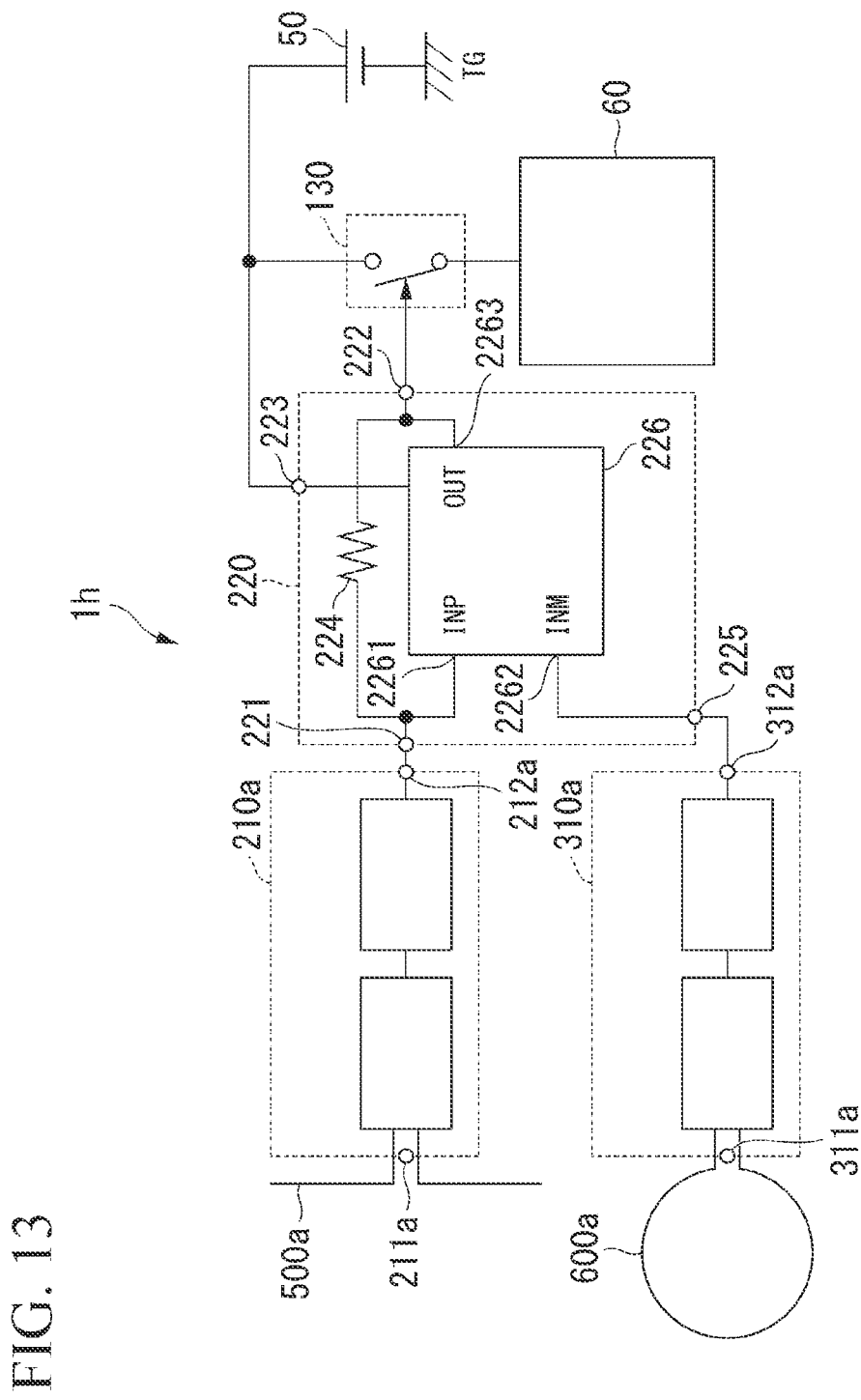
FIG. 13 is a diagram illustrating a first modified example of the constitution of the latch module in the third embodiment.

FIG. 13 is a diagram illustrating a first modified example of the constitution of the latch module 1 in the third embodiment. A latch module 1h illustrated in FIG. 7 is a modified example of the latch module 1g described above. A constituent element in this example that is the same as the latch module 1g will be denoted by the same reference symbol and a description thereof will be omitted. The latch module 1h has a constitution different from that of the latch module 1g in that a power detector 226 is included in a control circuit 220 and a flip-flop 227 is not included.

A constitution of the control circuit 220 included in the latch module 1h is the same as that of the control circuit 120b illustrated in FIG. 3. That is to say, a constitution of the power detector 226 included in the control circuit 220 is the same as that of the power detector 126 illustrated in FIGS. 4A and 4B.

In the example associated with the latch module 1h, a first DC power output terminal 212a of a first power conversion circuit 210a is connected to a first input terminal 221 of the control circuit 220. That is to say, when an electric field type antenna 500a receives first radio waves, a current proportional to electric power due to the received radio waves is input to a detection input terminal 2261 of the power detector 226. In this case, when a potential proportional to the current input to an input terminal 2261 is higher than a reference input potential VDET in the power detector 226, a high level is output to a voltage detection output terminal 2263 and a switch 130 is controlled to be in a conduction state.

Also, a second DC power output terminal 312a of a second power conversion circuit 310a is connected to a second input terminal 225 of the control circuit 220. That is to say, when a magnetic field type antenna 600a receives second radio waves, a current proportional to the electric power obtained using the received radio waves is input to a reference input terminal 2262 of the power detector 226. In the power detector 226, a current amplifier is present in the next stage of an input terminal 2262. A current input to the reference input terminal 2262 is amplified to be doubled using the current amplifier. Furthermore, a current adder in the next stage subtracts a current input to the reference input terminal 2262 from a current input to the detection input terminal 2261. When a potential proportional to the current which has passed through the current adder is lower than the reference input potential VDET in the power detector 226, a low level is output to the voltage detection output terminal 2263 and the switch 130 is controlled to be in a non-conduction state.

In this way, the latch module 1h including the control circuit 220 having the power detector 226 operates in the same manner as in the latch module 1g including the control circuit 220a having the flip-flop 227.

When the latch module 1h includes the power detector 226 in the control circuit 220, it is possible to further reduce power consumption as compared with the latch module 1g.

Figure 14:
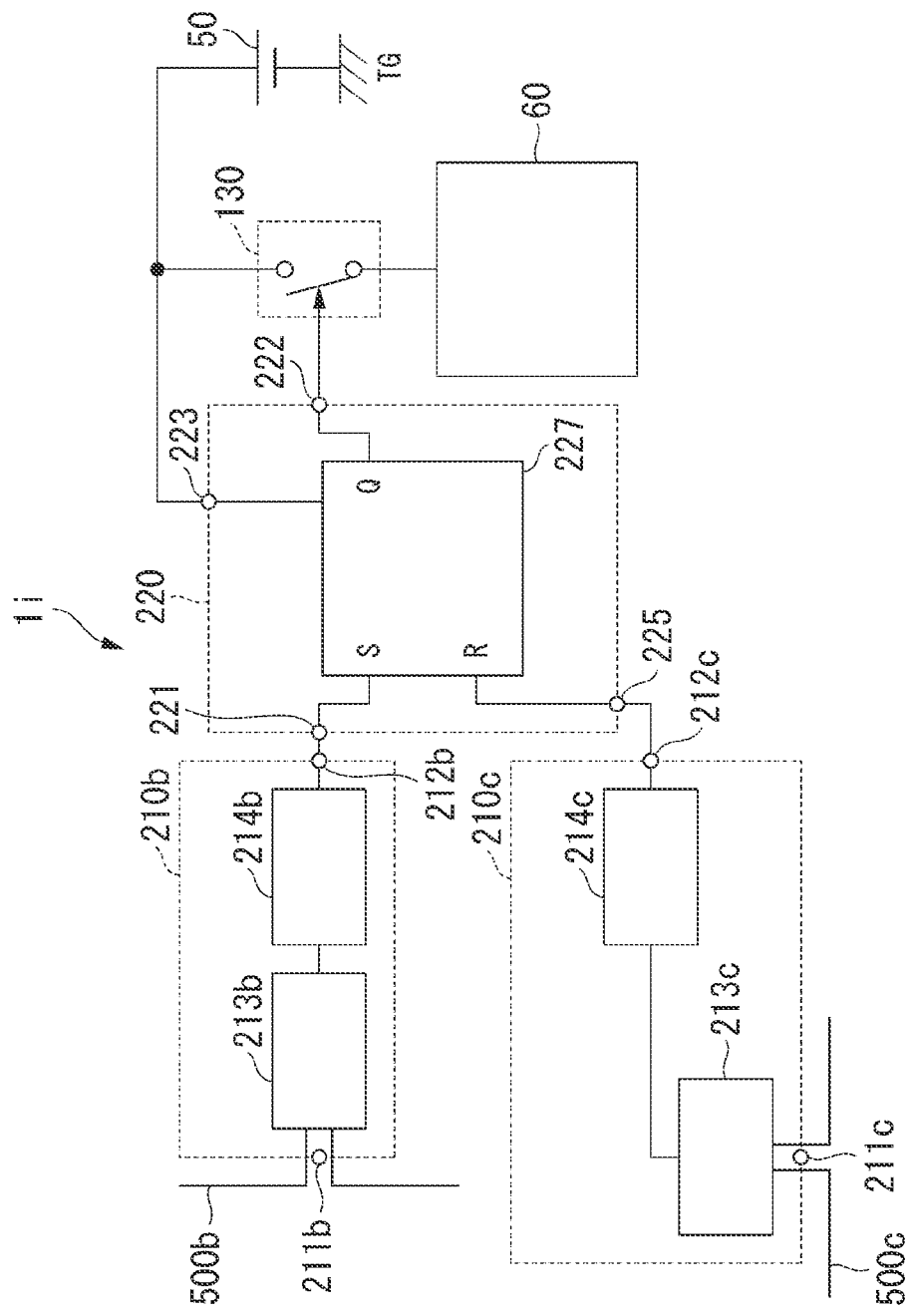
FIG. 14 is a diagram illustrating a second modified example of the constitution of the latch module in the third embodiment.

FIG. 14 is a diagram illustrating a second modified example of the constitution of the latch module 1 in a third embodiment. A latch module 1i illustrated in FIG. 14 is a modified example of the latch module 1g described above. A constituent element in the second modified example that is the same as the latch module 1g will be denoted by the same reference symbol and a description thereof will be omitted. The latch module 1i has a different constitution from the latch module 1g in that an electric field type antenna 500 is used for both a first antenna 240 and a second antenna 340.

In the example illustrated in FIG. 14, the electric field type antenna 500b (the first antenna 240) and the electric field type antenna 500c (the second antenna 340) are provided at different positions from each other. That is to say, in the latch module 1i, installation positions of the antennas are different from each other. Each of the installation positions is a position in the latch module 1i in which the antenna is installed.

The electric field type antenna 500b is installed to be able to receive first radio waves in a first direction. The electric field type antenna 500c is installed to be able to receive second radio waves in a second direction different from the first direction.

Figure 15:
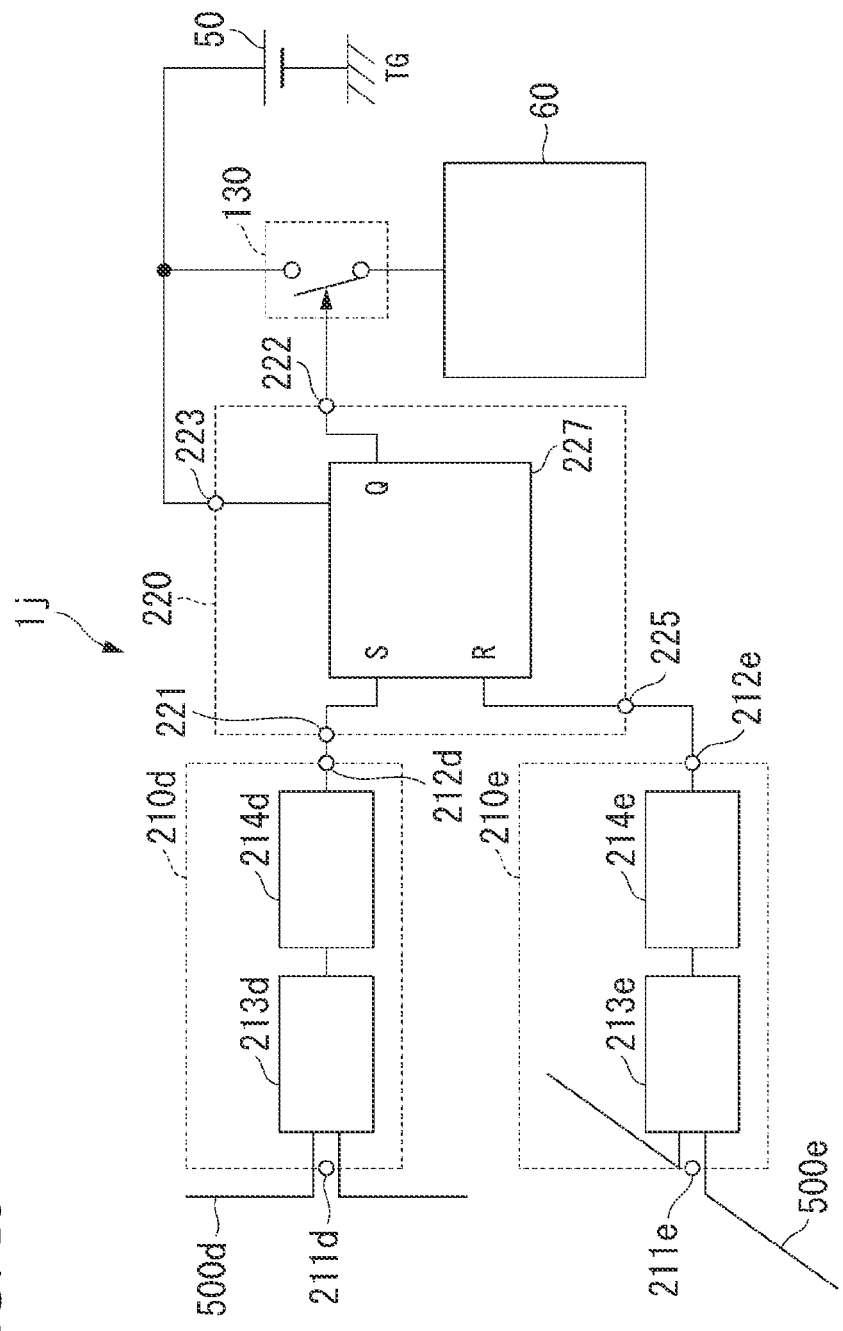
FIG. 15 is a diagram illustrating a third modified example of the constitution of the latch module in the third embodiment.

FIG. 15 is a diagram illustrating a second modified example of the constitution of the latch module 1 in the third embodiment. A latch module 1i illustrated in FIG. 15 is a third modified example of the latch module 1i described above. A constituent element in this example that is the same as the latch module 1i will be denoted by the same reference symbol and a description thereof will be omitted. The latch module 1j has a constitution different from that of the latch module 1h in that installation angles of the first antenna 240 and the second antenna 340 are different from each other.

In this example illustrated in FIG. 15, the latch module 1j includes an electric field type antenna 500d and an electric field type antenna 500e. The electric field type antenna 500d is an example of the first antenna 240 and the electric field type antenna 500e is an example of the second antenna 340.

In the example illustrated in FIG. 15, the electric field type antenna 500b (the first antenna 240) and the electric field type antenna 500c (the second antenna 340) are provided at different angles. That is to say, since the first radio waves and the second radio waves are provided at different angles, the first radio waves and the second radio waves do not interfere with each other.

As an example, the electric field type antenna 500b (the first antenna 240) and the electric field type antenna 500c (the second antenna 340) may be provided perpendicular to each other.

Figure 16A:
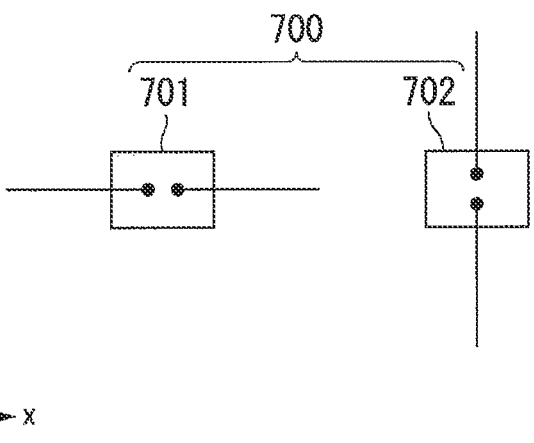
FIGS. 16A and 16B are diagrams illustrating a fourth modified example of the constitution of the latch module in the third embodiment.
Figure 16B:
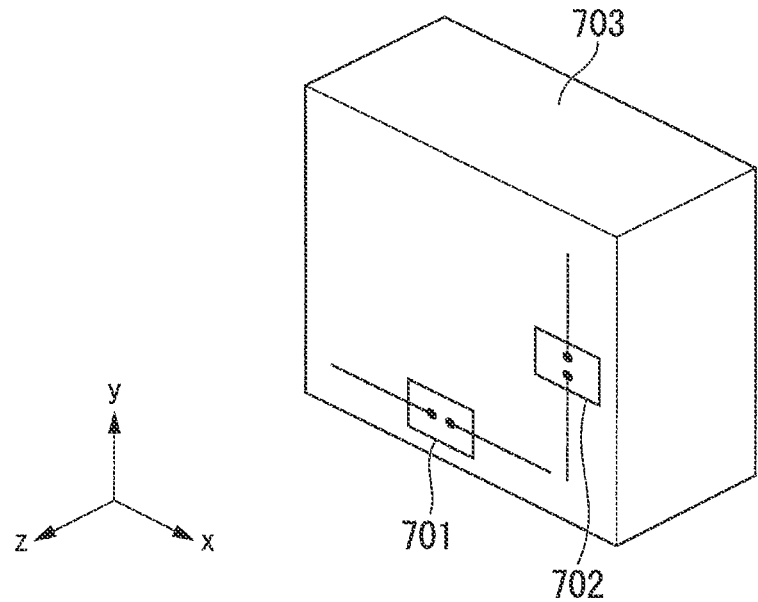

FIGS. 16A and 16B are diagrams illustrating a fourth modified example of the constitution of the latch module 1 in the third embodiment.

FIG. 16A is a diagram illustrating the arrangement of an antenna 701 and an antenna 702 using a two-dimensional Cartesian coordinate system of an x axis and a y axis. The antenna 701 illustrated in FIG. 9 is an example of the first antenna 240 described above and the antenna 702 is an example of the second antenna 340 described above. Hereinafter, when the antenna 701 and the antenna 702 are not distinguished, the antenna 701 and the antenna 702 are referred to as an "antenna 700." The antenna 700 is an example of the electric field type antenna 500.

The antenna 701 is arranged along the x axis. The antenna 702 is arranged along the y axis. In this example, the antenna 701 and the antenna 702 are arranged at different angles from each other.

FIG. 16B is a diagram illustrating the arrangement of the antenna 701 and the antenna 702 using a three-dimensional Cartesian coordinate system of an x axis, a y axis, and a z axis. In FIG. 16B, the arrangement of the antenna 701 and the antenna 702 illustrated using the two-dimensional Cartesian coordinate system of the x axis and the y axis in FIG. 16A is illustrated in a three-dimensional space.

The antenna 701 and the antenna 702 are accommodated in a housing 703. Furthermore, the antenna 701 and the antenna 702 are arranged in the same plane. When the antenna 701 and the antenna 702 are arranged at different angles from each other as illustrated in (B) of FIG. 16, even when the antenna 701 and the antenna 702 are arranged on the same plane, the first radio waves and the second radio waves do not interfere with each other.

Figure 17:
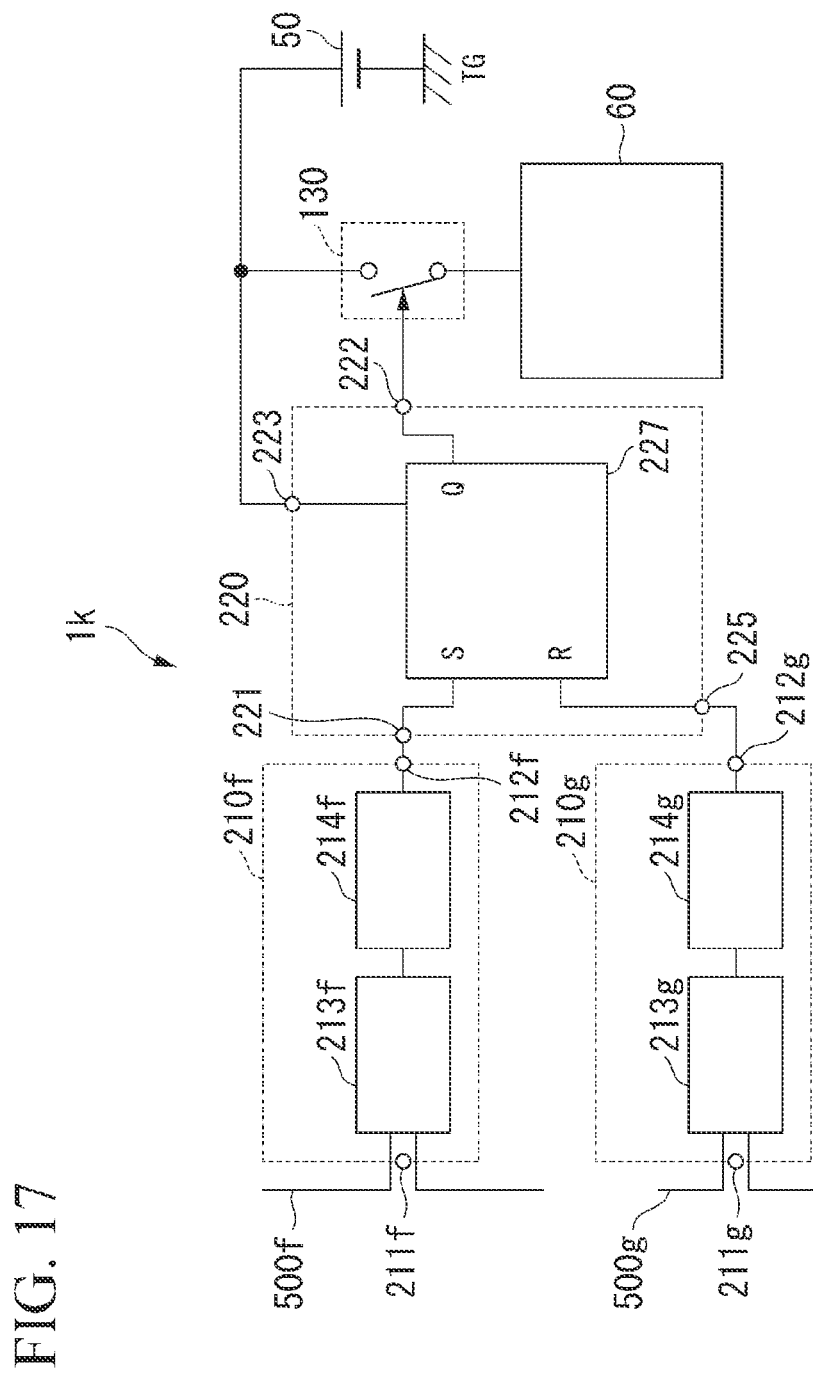
FIG. 17 is a diagram illustrating a fifth modified example of the constitution of the latch module in the third embodiment.

FIG. 17 is a diagram illustrating a fifth modified example of the constitution of the latch module 1 in the third embodiment. A latch module 1k illustrated in FIGS. 10A and 10B is a modified example of the latch module 1j described above. A constituent element in this example that is the same as the latch module 1j will be denoted by the same reference symbols and a description thereof will be omitted. The latch module 1k has a constitution different from that of the latch module 1j in that, although the installation angles of the first antenna 240 and the second antenna 340 are the same, the first antenna 240 and the second antenna 340 include the dipole antennas 501 having different lengths from each other.

In the example illustrated in FIG. 17, the latch module 1k includes an electric field type antenna 500f and an electric field type antenna 500g. The electric field type antenna 500f is an example of the first antenna 240 and the electric field type antenna 500g is an example of the second antenna 340.

In this example, the electric field type antenna 500f and the electric field type antenna 500g includes antennas having lengths different from each other. In order to prevent the interference between the first radio waves and the second radio waves, the length of the electric field type antenna 500f and the length of the electric field type antenna 500g are selected on the basis of frequency of the radio waves. For example, the length of the electric field type antenna 500f and the length of the electric field type antenna 500g are preferably ½ or ¼ of wavelengths λ of the radio waves received by the antennas. In this case, the electric field type antenna 500f and the electric field type antenna 500g can efficiently receive radio waves without generating reflected waves.

To be specific, when the frequency of the first radio waves is 2.4 GHz and the frequency of the second radio waves is 5 GHz, a wavelength of the first radio waves is about 12.5 cm and a wavelength of the second radio waves is about 6 cm. Furthermore, when a dipole antenna with a wavelength of λ/2 is utilized, in each antenna, a length of the antenna configured to receive the first radio waves is 6.25 cm and a length of the antenna configured to receive the second radio waves is 3 cm.

As described above, when a constitution in which a latch module 1k in which the dipole antenna 501 having an antenna length of ½ of the wavelengths λ of the first radio waves and the second radio waves of different wavelengths is utilized is provided, it is possible to prevent the interference between the first radio waves and the second radio waves. In this case, one of the radio waves can be used for turning on the switch 130 and the other of the radio waves can be used for turned off the switch 130.

Although a case in which a length of the first antenna 240 and a length of the second antenna 340 are different has been described using an example of the dipole antenna 501, the same applies not only to an example of the dipole antenna 501, but also to the monopole antenna 502, the inverted F antenna 503, the meander line antenna 504, and the chip antenna 505. Similarly, these antennas may be configured so that the length of the antenna included in the first antenna 240 and the length of the antenna included in the second antenna 340 are different.

Figure 18:
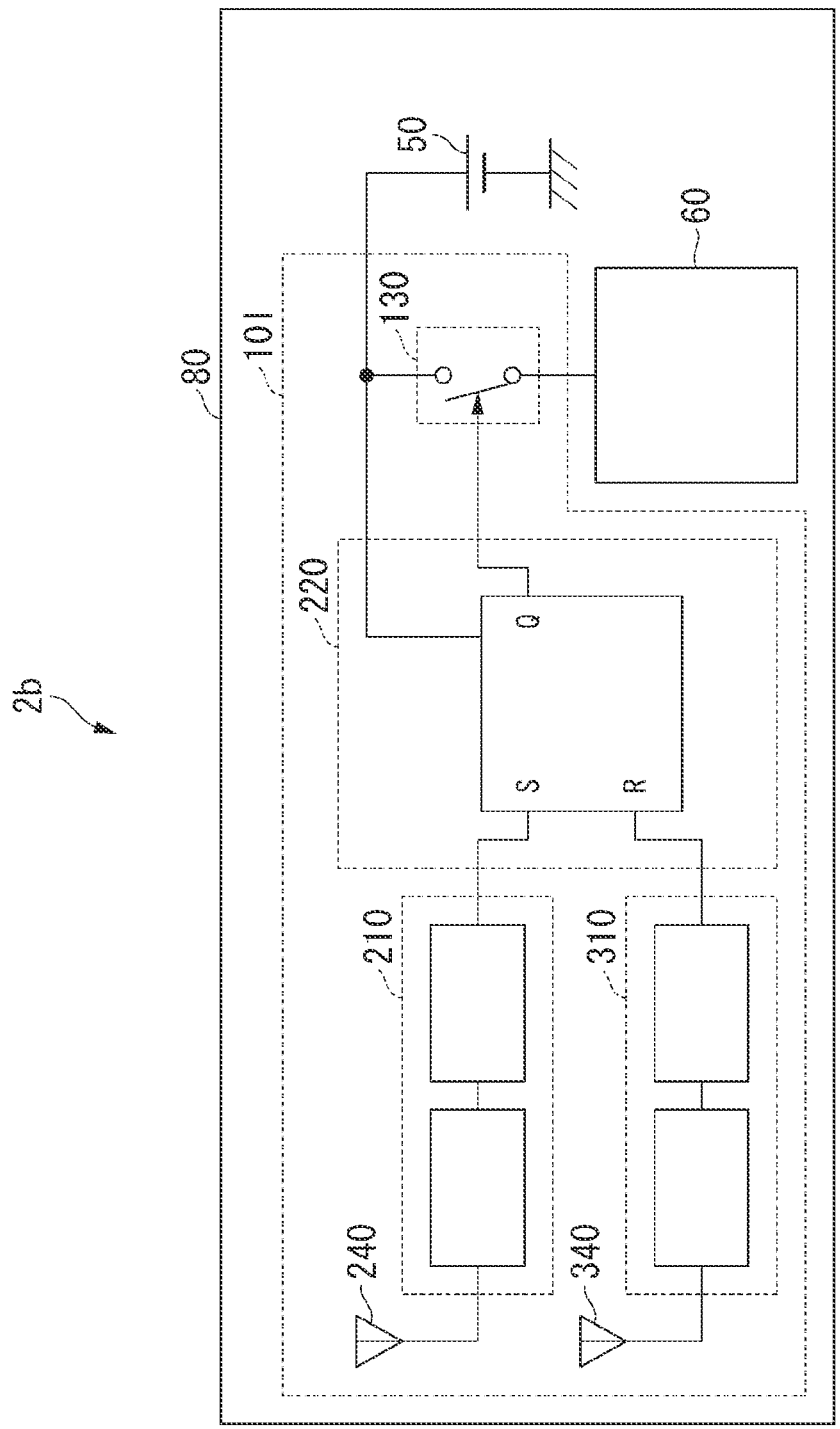
FIG. 18 is a diagram illustrating an example of a housing with a waterproof structure in the third embodiment.

FIG. 18 is a diagram illustrating an example of a housing having a waterproof structure in the third embodiment. As illustrated in FIGS. 11A and 11B, a latch waterproof module 2b includes a latch circuit 101, a power supply 50 configured to output DC electric power, a load 60 driven using DC electric power supplied from the power supply 50, and a housing 80.

The housing 80 includes the latch circuit 101, the power supply 50, and the load 60 accommodated therein. The housing 80 is waterproof.

[Summary of Effects of Third Embodiment]

According to the embodiment described above, the latch module 1 switches a connection state of the switch 130 by detecting the first radio waves received by the first antenna 240 and the second radio waves received by the second antenna 340. The latch module 1 can switch the switch 130 from a non-conduction state to a conduction state when configured in this way. Furthermore, the latch module 1 can switch the switch 130 from a conduction state to a non-conduction state.

Also, according to the above-described embodiment, the first antenna 240 and the second antenna 340 are provided at different positions from each other. Therefore, the latch module 1 can prevent the first radio waves in the first direction and the second radio waves in the direction different from the first direction from interfering with each other. That is to say, it is possible to prevent malfunction.

Furthermore, according to the above-described embodiment, the first antenna 240 and the second antenna 340 are provided at different angles from each other. Therefore, the latch module 1 can prevent the first radio waves in the first direction and the second radio waves in the direction different from the first direction from interfering with each other. That is to say, it is possible to prevent malfunction.

In addition, according to the above-described embodiment, the first antenna 240 and the second antenna 340 are provided perpendicular to each other. Therefore, according to the above-described embodiment, it is possible to prevent the first radio waves and the second radio waves from interfering with each other. That is to say, it is possible to prevent malfunction.

Moreover, according to the above-described embodiment, the first antenna 240 is the electric field type antenna 500 and the second antenna 340 is the magnetic field type antenna 600. Therefore, it is possible to prevent the first radio waves and the second radio waves from interfering with each other. That is to say, it is possible to prevent malfunction.

Fourth Embodiment

A fourth embodiment of the present invention will be described below with reference to the drawings.

Figure 19:
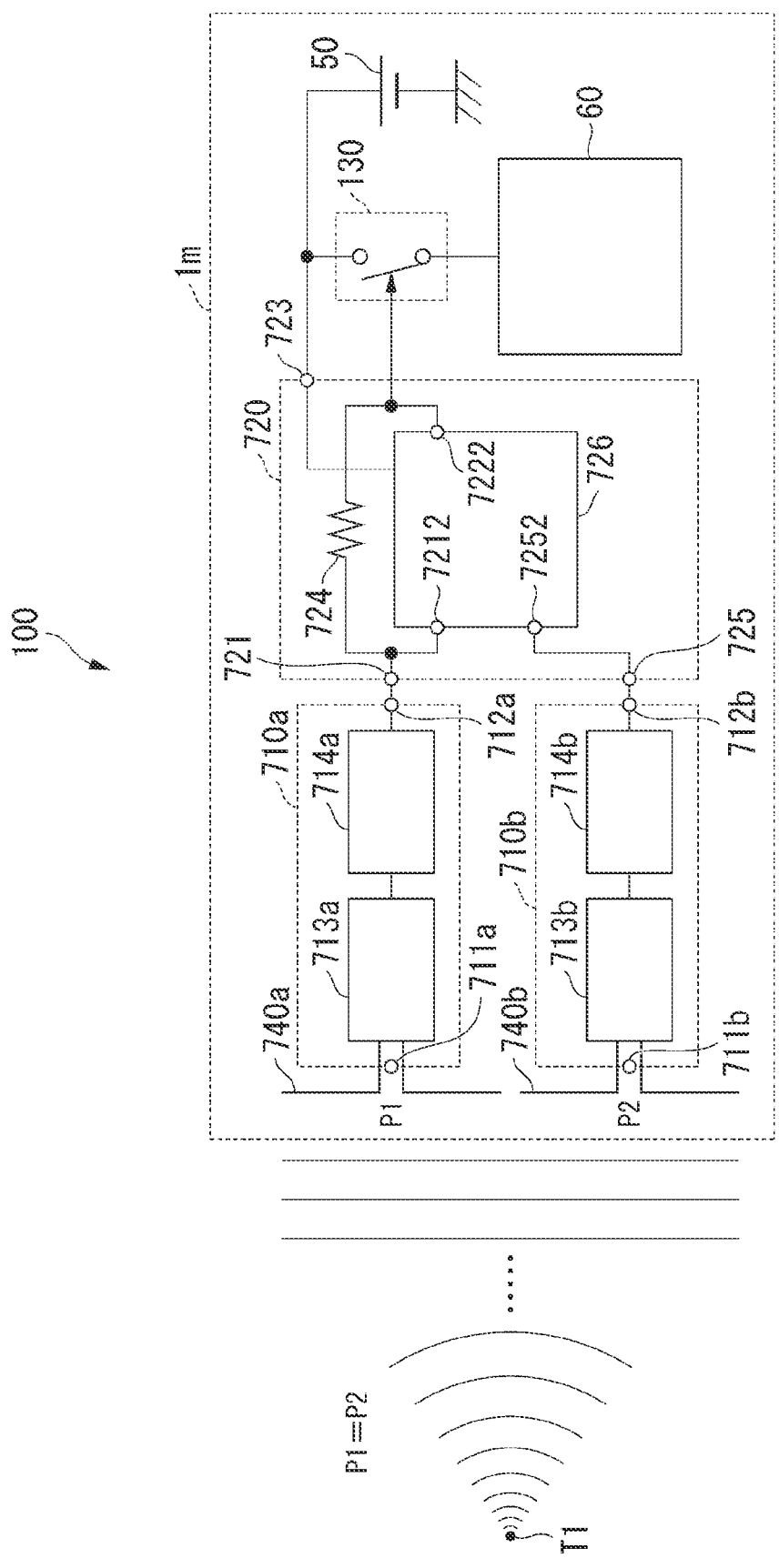
FIG. 19 is a diagram illustrating an example of a constitution of a latch system in a fourth embodiment.

FIG. 19 is a diagram illustrating an example of a constitution of a latch system 100 in the fourth embodiment. In FIG. 19, a latch module 1m includes a first antenna 740a, a second antenna 740b, a first power conversion circuit 710a, a second power conversion circuit 710b, a control circuit 720, a switch 130, a power supply 50, and a load 60. The first power conversion circuit 710a may include an RF-DC conversion circuit 713a and a booster circuit 714a and the second power conversion circuit 710b may include an RF-DC conversion circuit 713b and a booster circuit 714b.

The first antenna 740a is provided to be able to receive radio waves. The second antenna 740b is provided to be able to receive radio waves and has substantially the same characteristics and gain as in the first antenna 740a. The first antenna 740a and the second antenna 740b are arranged distance from each other at a predetermined distance.

In this example, a transmission point T1 indicates a point far from a point in which the first antenna 740a is provided and a point in which the second antenna 740b is provided. To be specific, the antennas are installed at places in which the radio waves transmitted from the transmission point T1 is in a far field.

Radio waves are divided into a far field and a near field in accordance with the distance from the transmission point. For example, a boundary position between a far field and a near field is represented by $\lambda/2\pi$ using a wavelength λ of radio waves. As an example, at 2.4 GHz, about 2 cm from a transmission point is a boundary between a far field and a near field.

Since radio waves can be regarded as plane waves in a far field, if distances from a transmission point are the same, an electric field intensity and a magnetic field intensity are theoretically the same. An intensity is inversely proportional to the first power of distance.

On the other hand, in a near field, in an electric field antenna, an electric field intensity is inversely proportional to the third power of distance and a magnetic field intensity is inversely proportional to the second power of distance. In addition, in a magnetic field antenna, an electric field intensity is inversely proportional to the second power of distance and a magnetic field intensity is inversely proportional to the third power of distance. That is to say, an electric field intensity and a magnetic field intensity in a near field have a significantly larger change in intensity depending on a distance than in a far field.

When radio waves from a far field is received, the radio waves seen from the first antenna 740a and the second antenna 740b are plane waves and magnitudes of electric powers P1 and P2 received by the antennas are substantially the same In this embodiment, the first antenna 740a and the second antenna 740b have substantially the same characteristics and gain. Thus, when each of the first antenna 740a and the second antenna 740b receives radio waves from the transmission point T1, the DC electric power output by the first power conversion circuit 710a and the DC electric power output by the second power conversion circuit 710b are substantially the same.

In this example, radio waves from a far field are regarded as noise. The radio waves from the far field are radio waves floating in the environment. For example, when the latch module 1m receives the radio waves from the far field, a malfunction in which a connection state of the switch 130 is switched is likely to be caused.

The first power conversion circuit 710a includes a first power input terminal 711a to which electric power obtained when the first antenna 740a receives radio waves input and a first DC power output terminal 712a configured to output DC electric power, converts electric power input to the first power input terminal 711a into DC electric power, and outputs the converted DC electric power from the first DC power output terminal 712a.

The second power conversion circuit 710b includes a second power input terminal 711b to which electric power obtained when the second antenna 740b receives radio waves is input and a second DC power output terminal 712b configured to output DC electric power, converts electric power input to the second power input terminal 711b into DC electric power, and outputs the converted DC electric power from the second DC power output terminal 712b.

The control circuit 720 includes a first input terminal 721 connected to the first DC power output terminal 712a of the first power conversion circuit 710a, a second input terminal 725 connected to the second DC power output terminal 712b of the second power conversion circuit 710b, an output terminal 722 connected to the switch 130 and configured to control a connection state of the switch 130, and a power supply terminal 723.

The power supply terminal 723 of the control circuit 720 is connected to the power supply 50. The load 60 is connected to the power supply 50 via the switch 130.

The control circuit 720 switches a connection state of the switch 130 in accordance with the result of comparing the electric power input to the first input terminal 721 with the electric power input to the second input terminal 725.

Figure 20:
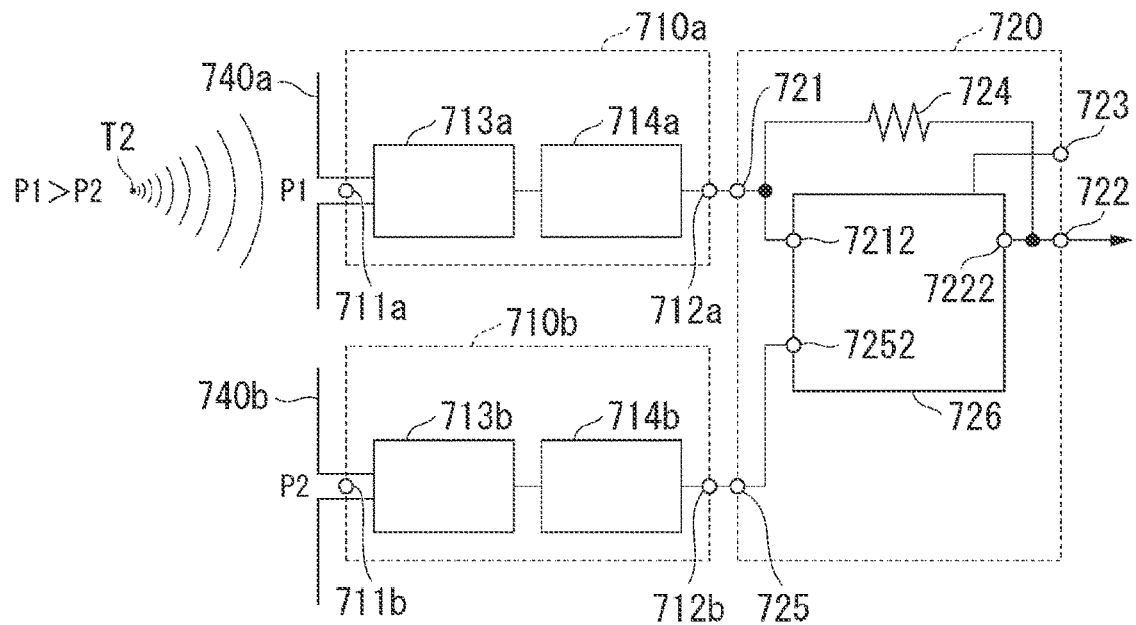
FIG. 20 is a diagram illustrating a case in which a first antenna receives radio waves in an example of the constitution of the latch system in the fourth embodiment.

FIG. 20 is a diagram illustrating a case in which the first antenna 740a receives radio waves having an intensity higher than that of the second antenna 740b in an example of the constitution of the latch system 100 in the fourth embodiment. A constituent element in this case that is the same as the latch module 1m described above will be denoted by the same reference symbol and a description thereof will be omitted.

In this example, a transmission point T2 is located in a near field of the first antenna 740a. In the near field, a change in electric field intensity and magnetic field intensity depending on a distance is large. Thus, the electric power due to the radio waves received by the first antenna 740a is significantly different from the electric power due to the radio waves received by the second antenna 740b.

For example, if radio waves are transmitted in the vicinity of the first antenna 740a, an electric field intensity and a magnetic field intensity in the vicinity of the second antenna 740b are significantly attenuated with respect to an electric field intensity and a magnetic field intensity in the vicinity of the first antenna 740a.

When the transmission point T2 is located in the near field of the first antenna 740a, the electric power due to the radio waves received by the first antenna 740a is significantly different from the electric power due to the radio waves received by the second antenna 740b. Thus, the DC electric power output by the first power conversion circuit 710a is significantly different from the DC electric power output by the second power conversion circuit 710b. That is to say, the electric power input to the first input terminal 721 of the control circuit 720 is significantly different from the electric power input to the second input terminal 725.

The control circuit 720 switches a connection state of the switch 130 in accordance with the result of comparing the electric powers input to the first input terminal 721 and the second input terminal 725. Thus, when the transmission point T2 is located in the near field of the first antenna 740a, a connection state of the switch 130 is switched.

For example, the control circuit 720 controls the switch 130 to be in a conduction state when the electric power input to the first input terminal 721 is twice or more the electric power input to the second input terminal 725.

Figure 21:
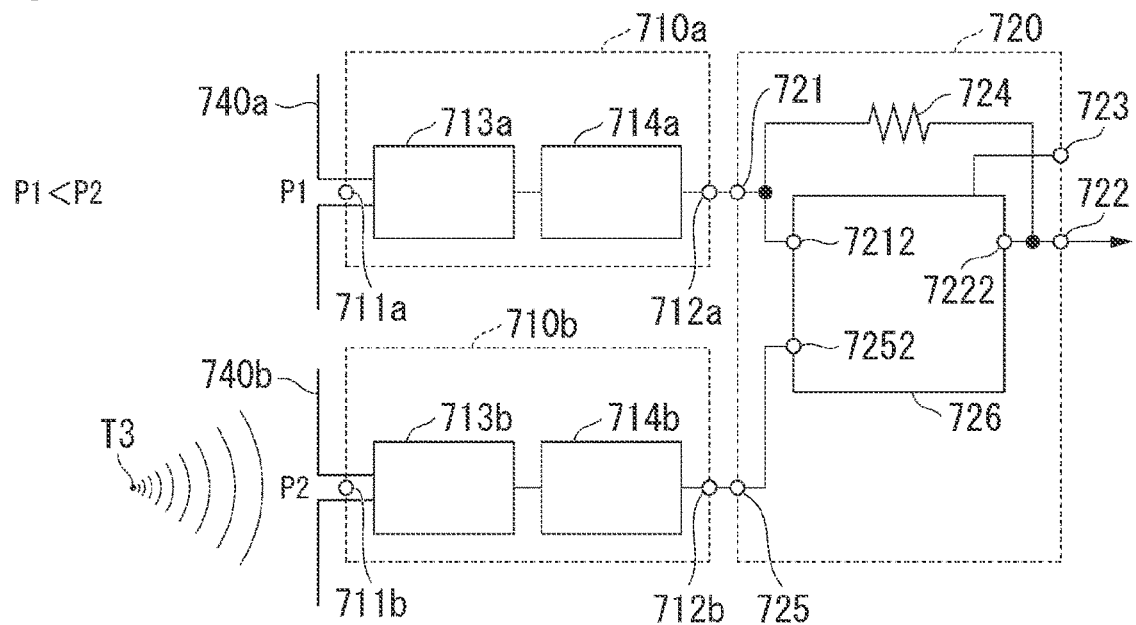
FIG. 21 is a diagram illustrating a case in which a second antenna receives radio waves in an example of the constitution of the latch system in the fourth embodiment.

FIG. 21 is a diagram illustrating a case in which the second antenna 740b receives radio waves having an intensity higher than that of the first antenna 740a in an example of the constitution of the latch system 100 in the fourth embodiment. A constituent element in this case that is the same as the latch module 1m described above will be denoted by the same reference symbol and a description thereof will be omitted.

In this example, a transmission point T3 is located in a near field of the second antenna 740b. If radio waves are transmitted from the transmission point T3 near the second antenna 740b, an electric field intensity and a magnetic field intensity in the vicinity of the first antenna 740a are significantly attenuated with respect to an electric field intensity and a magnetic field intensity in the vicinity of the second antenna 740b.

For example, when the electric power input to the second input terminal 725 is larger than the electric power input to the first input terminal 721 by a predetermined amount or more, the control circuit 720 controls the switch 130 to be in a non-conduction state.

As illustrated in FIGS. 20 and 21, when radio waves in a near field are transmitted near either the first antenna 740a or the second antenna 740b, it is possible for the latch circuit 10 to detect a position of a transmitter and it is possible for the latch circuit 10 to switch a connection state of the switch 130 without a malfunction.

The characteristics and gains of the two antennas may be described as substantially the same in some cases. Substantially the same characteristics and gain are not limited to substantially the same outer shape and material of the antennas. For example, when the characteristics and gains of the two antennas are substantially the same, if each of the antennas receives radio waves from transmission points in which distances from the two antennas are the same as each other, they convert electric power into substantially the same magnitude.

Figures 22A, 22B:
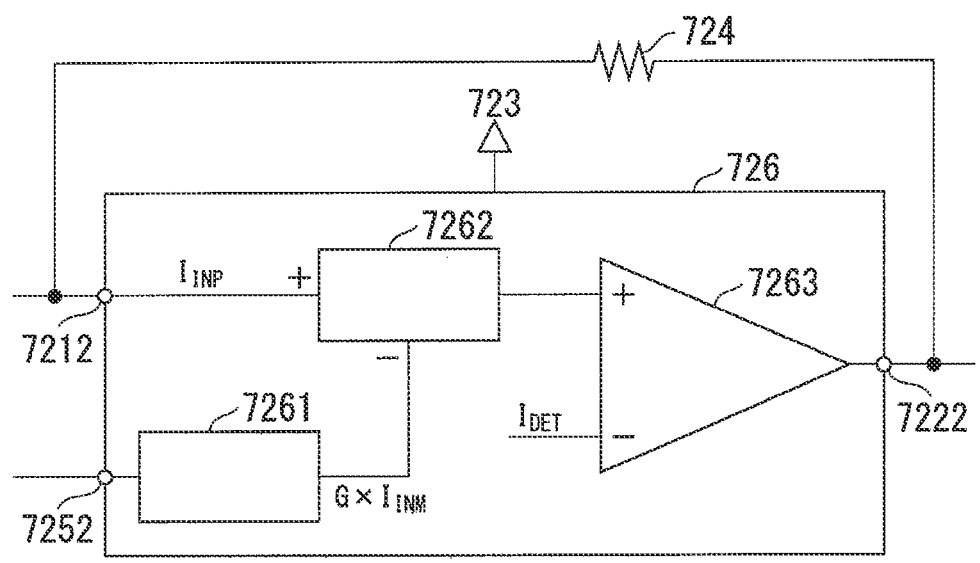
FIGS. 22A and 22B are exemplary diagrams illustrating a constitution of a power detector in the fourth embodiment.

FIGS. 22A and 22B are exemplary diagrams illustrating a constitution of the control circuit 720 in the fourth embodiment.

FIG. 22A is a diagram illustrating an example of a circuit constitution of the control circuit 720 in the fourth embodiment. As illustrated in FIG. 22A, the control circuit 720 is constituted of a power detector 726 and a feedback resistor 724. The power detector 726 includes a first input terminal 7212, a second input terminal 7252, and the output terminal 7222 as input/output terminals. The power detector 726 has the output terminal 7222 connected to the first input terminal 7212 via the feedback resistor 724. The feedback resistor 724 feeds back the electric power of the output terminal 7222 of the power detector 726 to an input terminal 7212. For this reason, if the output terminal 7222 is a high level, the power detector 726 maintains a high level of an output terminal 7212 unless a large amount of electric power is input to the second input terminal 7252 to make the switch 130 non-conduction. The power detector 726 includes a current amplifier 7261, a current adder 7262, and a current comparator 7263 as constituent elements. The power detector 726 compares the electric powers input to the first input terminal 7212 and the second input terminal 7252 by comparing the currents input as values proportional to the electric powers input to the first input terminal 7212 and the second input terminal 7252.

The current amplifier 7261 amplifies a current $I_{INM}$ input to the second input terminal 7252. In this example, the current amplifier 7261 amplifies the current input to the second input terminal 7252 G times.

The current adder 7262 adds a current ($G \times I_{INM}$) obtained by amplifying a current ($G \times I_{INM}$) input to the second input terminal 7252 G times using the current amplifier 7261 and a current Imp input to the first input terminal 7212. The current adder 7262 outputs the sum current.

The current comparator 7263 compares the current ($I_{INP} - G \times I_{INM}$) output as a result of addition by the current adder 7262 with the detected current $I_{DET}$. The current comparator 7263 outputs a voltage corresponding to the comparison result to the output terminal 7222.

To be specific, the current comparator 7263 outputs a high level when the current output as a result of addition by the current adder 7262 is the detected current $I_{DET}$ or more and outputs a low level when the current output as a result of addition by the current adder 7262 is less than the detected current $I_{DET}$. Hereinafter, the current comparator 7263 is also be referred to as a "comparator."

That is to say, the current comparator 7263 outputs a high level when a difference between a current flowing through the first input terminal 7212 and a current obtained by amplifying a current flowing through the second input terminal 7252 G times using the current amplifier 7261 is the detected current $I_{DET}$ or more. Furthermore, the current comparator 7263 outputs a low level when a difference between a current flowing through the first input terminal 7212 and a current obtained by amplifying a current flowing through the second input terminal 7252 G times using the current amplifier 7261 is less than the detected current $I_{DET}$.

For example, when a gain (an amplification factor) of the current amplifier 7261 is set to a gain (an amplification factor) which is twice the gain (the amplification factor), the current comparator 7263 does not output a high level unless the current flowing through the first input terminal 7212 is a value or more obtained by adding the detected current $I_{DET}$ to a current obtained by doubling the current flowing through the second input terminal 7252.

Hereinafter, a state in which the current comparator 7263 outputs a low level to the output terminal 7222 is also referred to as an "off state" and a state in which the current comparator 7263 outputs a high level to the output terminal 7222 is also referred to as an "on state."

FIG. 22B is a table showing a correspondence relationship between a current input to the power detector 726 and an output potential.

When a current value obtained by subtracting a current obtained by amplifying the current flowing through the second input terminal 7252 G times from the current flowing through the first input terminal 7212 is the detected current $I_{DET}$ or more, the output terminal 7222 outputs a high level. Since the output terminal 7222 is connected to the switch 130, in this case, the control circuit 720 controls the switch 130 to be in a conduction state.

When a current value obtained by subtracting the current obtained by amplifying the current flowing through the second input terminal 7252 G times from the current flowing through the first input terminal 7212 is less than the detected current $I_{DET}$, the output terminal 7222 outputs a low level. Since the output terminal 7222 is connected to the switch 130, in this case, the control circuit 720 controls the switch 130 to be in a non-conduction state.

FIGS. 23A and 23B are exemplary diagrams illustrating a constitution of the power detector 726a having gain (amplification factor) switching in the fourth embodiment. The power detector 726a is an example of the power detector 726. A constituent element in this example that is the same as the power detector 726 will be denoted by the same reference numeral and a description thereof will be omitted.

An example of a case in which the power detector 726a switches a gain will be described with reference to FIGS. 23A and 23B. As an example, a case in which, when the power detector 726a is in an off state, a gain is doubled to prevent a malfunction, whereas when the power detector 726a is in an on state, a gain is set to a gain which is ½ times the gain so that it is difficult to shift to an off state will be described.

In this example, the power detector 726a includes a gain switch 7264.

When the second input terminal 7252 of the power detector 726a is connected to the current amplifier 7261, the current flowing through the second input terminal 7252 can obtain the doubled gain.

When the power detector 726a is in an off state and receives radio waves transmitted from a far field, the currents input to the first input terminal 7212 and the second input terminal 7252 are substantially the same. Thus, a current of the second input terminal 7252 having the doubled gain becomes larger and a potential of the output terminal 7222 is maintain in an off state. That is to say, when the latch module 1m includes the power detector 726a, it is possible to prevent a malfunction.

In a case in which the characteristics and gain of the two antennas are substantially the same, substantially the same range may be a range of the antenna characteristics in a state in which a current flowing through the second input terminal 7252 amplified by a double gain through the current amplifier 7261 connected to the second input terminal 7252 inside the power detector 726a when radio waves in a far field are received is larger than a current flowing through the first input terminal 7212 (that is, an on state) can be maintained.

On the other hand, when the power detector 726a receives radio waves in a near field to be in an on state, the power detector 726a can be maintained in an on state by performing setting so that the current $I_{INP}$ flowing through the first input terminal 7212 is larger than the current $I_{INM}$ flowing through the second input terminal 7252.

For example, if the gain (amplification factor) connected to the second input terminal 7252 is changed from 2 times to ½, even if the current input to the first input terminal 7212 and the current input to the second input terminal 7252 are substantially the same, the current flowing through the first input terminal 7212 becomes larger. Thus, it becomes difficult for the power detector 726a to shift to an off state. That is to say, the latch module 1m can be easily maintained in the on state.

Figure 24:
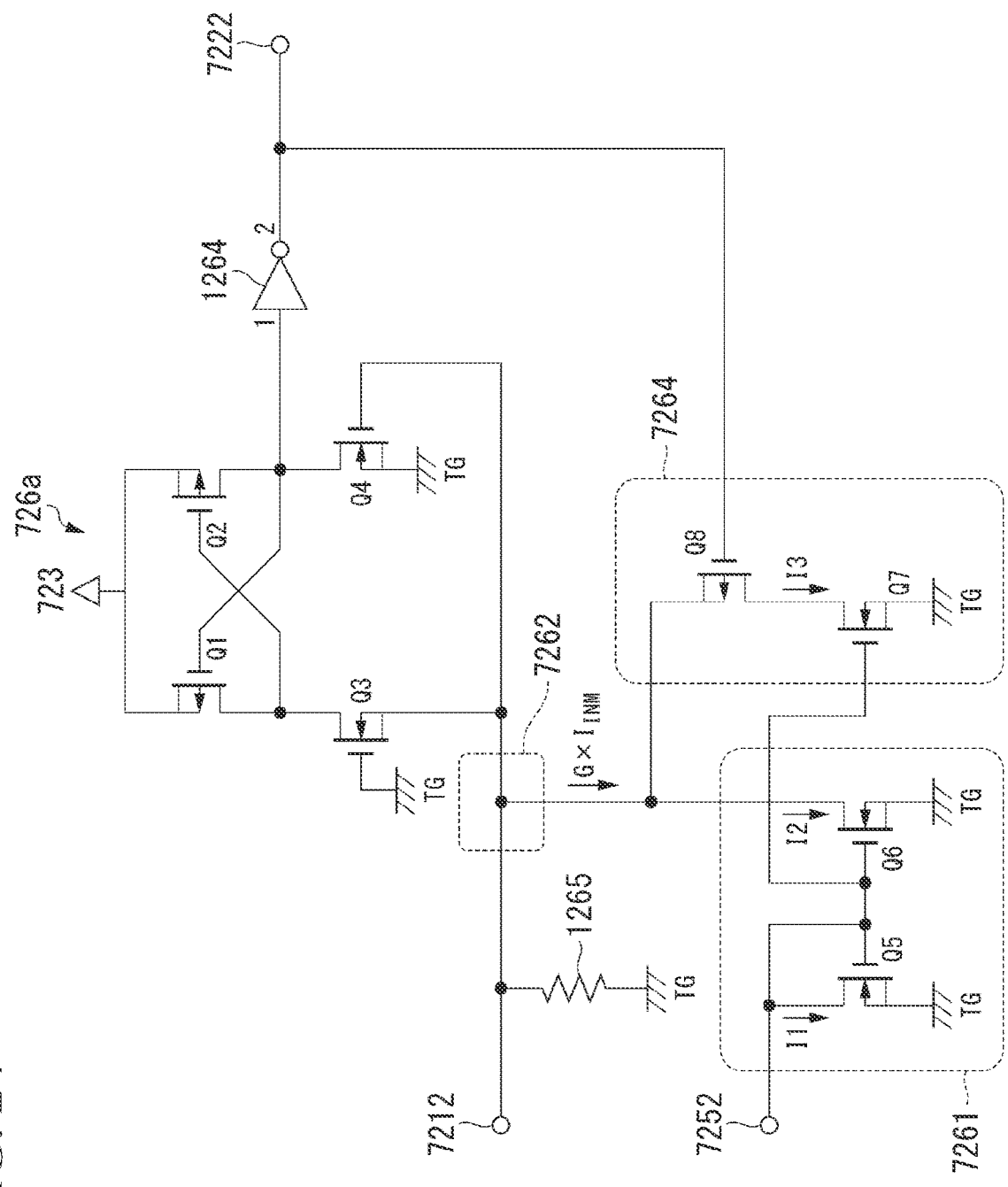
FIG. 24 is a diagram illustrating an example of a constitution of a circuit of the power detector having gain switching in the fourth embodiment.

FIG. 24 is a diagram illustrating an example of the circuit constitution of the power detector 726a having the gain switching in the fourth embodiment. A constituent element in this example that is the same as the power detector 126 described in the first embodiment will be denoted by the same reference numeral and a description thereof will be omitted. In FIG. 24, the power detector 726a further includes a current amplifier 7261, a current adder 7262, and a gain switch 7264.

The current amplifier 7261 includes a transistor Q5 and a transistor Q6. Both of the transistor Q5 and the transistor Q6 are n-channel type transistors. The transistor Q5 has a source connected to a ground point TG, a gate connected to a drain of the transistor Q5 and a gate of the transistor Q6, and the drain connected to the second input terminal 7252. The transistor Q6 has a source connected to the ground point TG, the gate connected to the gate of the transistor Q5, and a drain connected to the current adder 7262. The transistor Q5 and the transistor Q6 constitute a current mirror circuit. The current $I_{INM}$ input to the second input terminal 7252 flows between the drain and the source of the transistor Q5 as a current I1. In this example, ½×I1 flows between the drain and the source of the transistor Q6 as a current I2.

The gain switch 7264 includes a transistor Q7 and a transistor Q8. The transistor Q7 is an n-channel type transistor and the transistor Q8 is a p-channel type transistor.

The transistor Q7 has a source connected to the ground point TG, a gate connected to the gate of the transistor Q6, and a drain connected to a drain of the transistor Q8.

The transistor Q8 has a source connected to a connection point between the drain of the transistor Q6 and the current adder 7262, a gate connected to the output terminal 7222, and the drain connected to the drain of the transistor Q7. In this example, 3/2×I1 flows between the drain and the source of the transistor Q7 as a current I3.

The gain switch 7264 switches a current value of the current flowing through the current adder 7262 by controlling the current I3 in accordance with the state of the output terminal 7222.

When the output terminal 7222 is in a low level, the current I3 flows between the source and the drain of the transistor Q8. In this case, since I2+I3 (that is, ½×I1+3/2×I1=2×I1) flows through the current adder 7262, the gain is doubled.

When the output terminal 7222 is in a high level, a current does not flow between the source and the drain of the transistor Q8. In this case, since I2 (that is, ½×I1) flows through the current adder 7262, the gain is halved.

Here, a current flowing between a drain and a source of a MOS transistor is proportional to a gate width W and inversely proportional to a gate length L.

A value of the gain of the power detector 726a is arbitrarily adjusted using the gate width W and the gate length L of the MOS transistor constituting the transistor Q6 and the transistor Q7.

Figure 25:
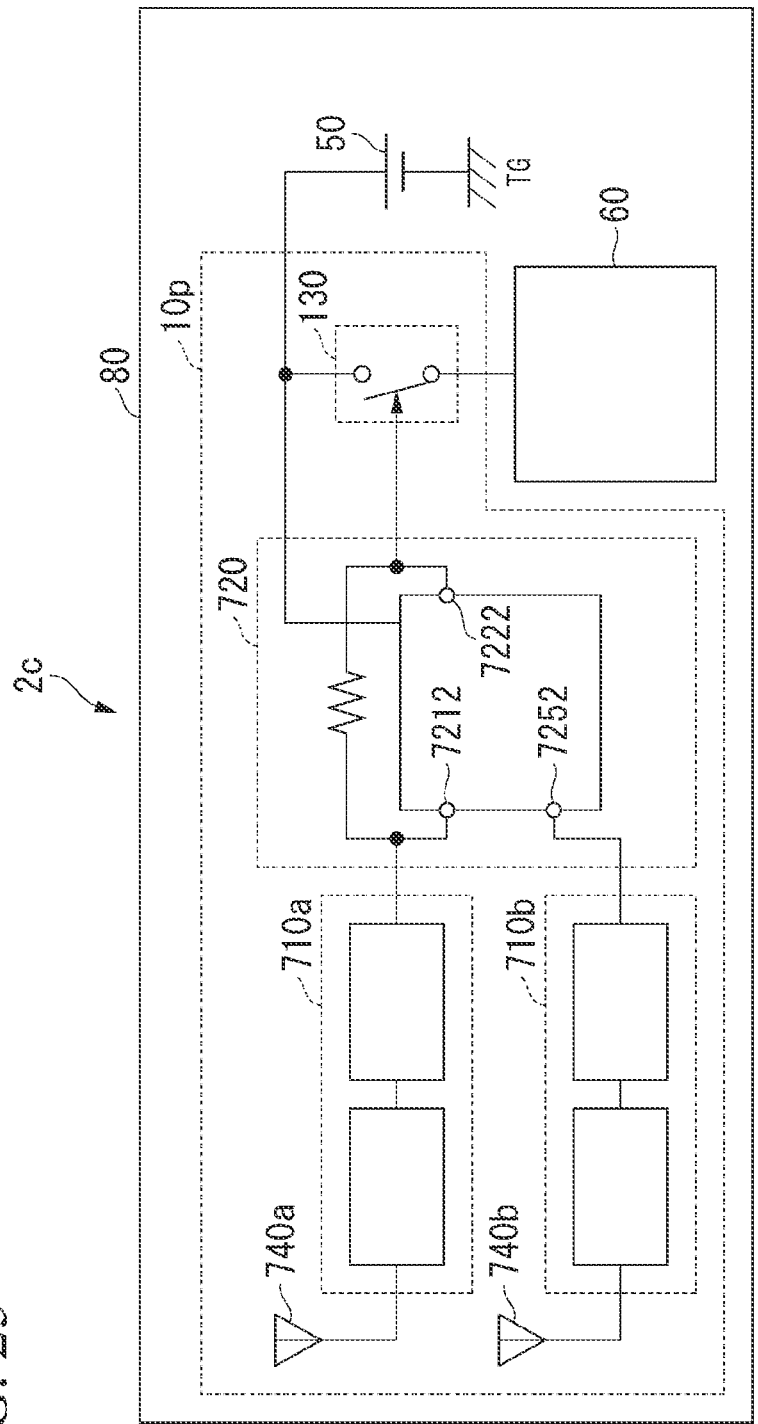
FIG. 25 is a diagram illustrating an example of a housing with a waterproof structure in the fourth embodiment.

FIG. 25 is a diagram illustrating an example of a housing 80 with a waterproof structure in the fourth embodiment. As illustrated in FIG. 25, a latch waterproof module 2c includes a latch circuit 10p, a power supply 50 configured to output DC electric power, a load 60 driven by DC electric power supplied from the power supply 50, and the housing 80.

The housing 80 includes the latch circuit 10p, the power supply 50, and the load 60 accommodated therein. The housing 80 is waterproof.

[Summary of Effects of Fourth Embodiment]

According to the embodiment described above, the latch module 1m includes the first antenna 740a and the second antenna 740b having substantially the same characteristics and gain as in the first antenna 740a. The control circuit 720 compares the electric power due to the radio waves received by the first antenna 740a with the electric power due to the radio waves received by the second antenna 740b.

When a difference between the electric power due to the radio waves received by the first antenna 740a and the electric power due to the radio waves received by the second antenna 740b is less than a predetermined value, the transmission point of radio waves is conceivable to be in a far field. Thus, the control circuit 720 does not switch the connection state of the switch 130. When a difference between the electric power due to the radio waves received by the first antenna 740a and the electric power due to the radio waves received by the second antenna 740b is a predetermined value or more, the transmission point of radio waves is conceivable to be in a near field. Thus, the control circuit 720 switches the connection state of the switch 130.

Therefore, the latch module 1m can detect that the noise radio waves from the far field is not near the transmitter regardless of the intensity of radio waves and can prevent a malfunction due to the radio waves from the far field.

Also, since these controls utilize the electric field characteristics of the transmission radio waves, power consumption of the battery of the circuit does not occur for detection.

Furthermore, according to the above-described embodiment, the control circuit 720 switches the connection state of the switch 130 to a conduction state when the electric power input from the first input terminal 721 is larger than the electric power input from the second input terminal 725 and switches the connection state of the switch 130 to a non-conduction state when the electric power input from the first input terminal 721 is smaller than the electric power input from the second input terminal 725.

Therefore, when the latch module 1m includes the control circuit 720, it is possible to switch the power supply 50 and the load 60 between a conduction state and a non-conduction state.

Furthermore, according to the above-described embodiment, the control circuit 720 includes the power detector 726. Therefore, the control circuit 720 including the power detector 726 can maintain the state of the switch 130 with low power consumption.

In addition, according to the above-described embodiment, when the power detector 726 includes the current amplifier 7261, in a case in which there is a difference between the electric power input to the first input terminal 7212 and the electric power input to the second input terminal 7252, the connection state of the switch 130 is switched.

The connection state of the switch 130 is switched only when a difference of a predetermined value or more set using the gain of the current amplifier 7261 is detected. Thus, the power detector 726 can prevent a malfunction.

Moreover, according to the above-described embodiment, the power detector 726a can switch the gain when including the gain switch 7264. It is possible to switch the gain between when the power detector 726a is in the on state and when the power detector 726a is in the off state.

In a state in which the power detector 726a is in the off state, when the power detector 726a increases a weight of the gain, the power detector 726a can be easily maintained in the off state and can prevent a malfunction.

In a case in which the power detector 726a is in the on state, when the power detector 726a reduces a weight of the gain, the power detector 726a can be easily maintained in the on state.

According to the above-described embodiment, the first antenna 740a and the second antenna 740b are arranged distance from each other at a predetermined distance. The latch module 1m switches the connection state of the switch 130 when the transmitter 70 is brought closer to the first antenna 740a or the second antenna 740b.

Therefore, the position in which the transmitter 70 is brought closer to the antenna to make the connection state of the switch 130 conductive is different from the position in which the transmitter 70 is brought closer to the antenna to make the connection state of the switch 130 non-conduction. Thus, it is possible to prevent a malfunction.

Fifth Embodiment

A fifth embodiment of the present invention will be described below with reference to the drawings.

Figure 26:
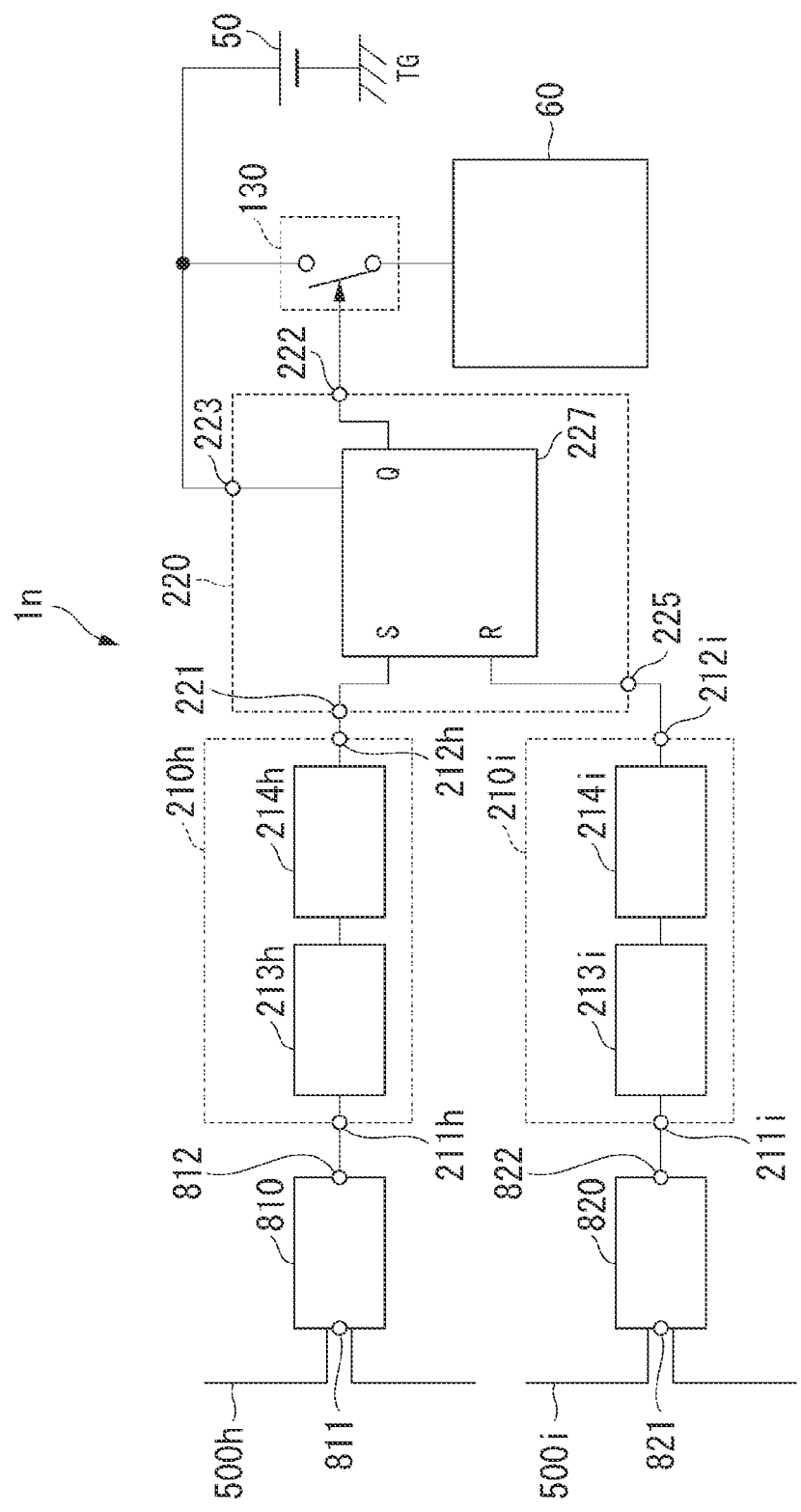
FIG. 26 is a diagram illustrating an example of a constitution of a latch module in a fifth embodiment.

FIG. 26 is a diagram illustrating an example of a constitution of a latch system 100 in the fifth embodiment. In FIG. 26, a latch module 1n includes a first antenna 500h, a second antenna 500i, a first power adjustment circuit 810, a first power conversion circuit 210h, a second power adjustment circuit 820, a second power conversion circuit 210i, a control circuit 220, a switch 130, a power supply 50, and a load 60.

In the following description, when the first power adjustment circuit 810 and the second power adjustment circuit 820 are not distinguished, they may be referred to as a "power adjustment circuit" in some cases. The power adjustment circuit adjusts the magnitude of electric power to be converted on the basis of the radio waves received by an antenna on a high gain side when a gain of the first antenna 500h is different from a gain of the second antenna 500i.

Both of the first antenna 500h and the second antenna 500i are provided to be able to receive radio waves. The first antenna 500h and the second antenna 500i may have the same characteristics and gains or may have different characteristics and gains.

The first power adjustment circuit 810 includes an input terminal 811 and an output terminal 812. The input terminal 811 is connected to the first antenna 500h. The output terminal 812 is connected to a first DC power output terminal 211h included in the first power conversion circuit 210h. The first power adjustment circuit 810 attenuates the radio waves input to the input terminal 811 and outputs the attenuated radio waves to the output terminal 812. That is to say, in this example, the first power adjustment circuit 810 is an attenuator. The first power adjustment circuit 810 attenuates the radio waves received by the first antenna 500h when a gain of the first antenna 500h is larger than a gain of the second antenna 500i.

The second power adjustment circuit 820 includes an input terminal 821 and an output terminal 822. The input terminal 821 is connected to the second antenna 500i. The output terminal 822 is connected to a second DC power output terminal 211i included in the second power conversion circuit 210i. The second power adjustment circuit 820 attenuates the radio waves input to the input terminal 821 and outputs the attenuated radio waves to the output terminal 822. That is to say, in this example, the second power adjustment circuit 820 is an attenuator. The second power adjustment circuit 820 attenuates the radio waves received by the second antenna 500i when a gain of the second antenna 500i is larger than a gain of the first antenna 500h.

That is to say, in this example, the power adjustment circuit is an attenuator configured to attenuate the radio waves received by an antenna on a high gain side when a gain of the first antenna 500h is different from a gain of the second antenna 500i.

The power adjustment circuit attenuates the magnitude of the received electric power so that the magnitude of the DC electric power input to a control circuit 220 is substantially the same. That is to say, the power adjustment circuit adjusts DC electric power output from a first DC power output terminal 212h included in the first power conversion circuit 210h and DC electric power output from a second DC power output terminal 212i included in the second power conversion circuit 210i so that the DC electric powers are made substantially the same as each other.

The power adjustment circuit may attenuate radio waves using another method instead of providing an attenuator. The power adjustment circuit may, for example, attenuate the radio waves received by an antenna on a high gain side by making impedance matching different, attenuate radio waves by increasing a length of the routing of a print pattern, attenuate radio waves using a filter circuit, or attenuate radio waves using stubs.

Figure 27:
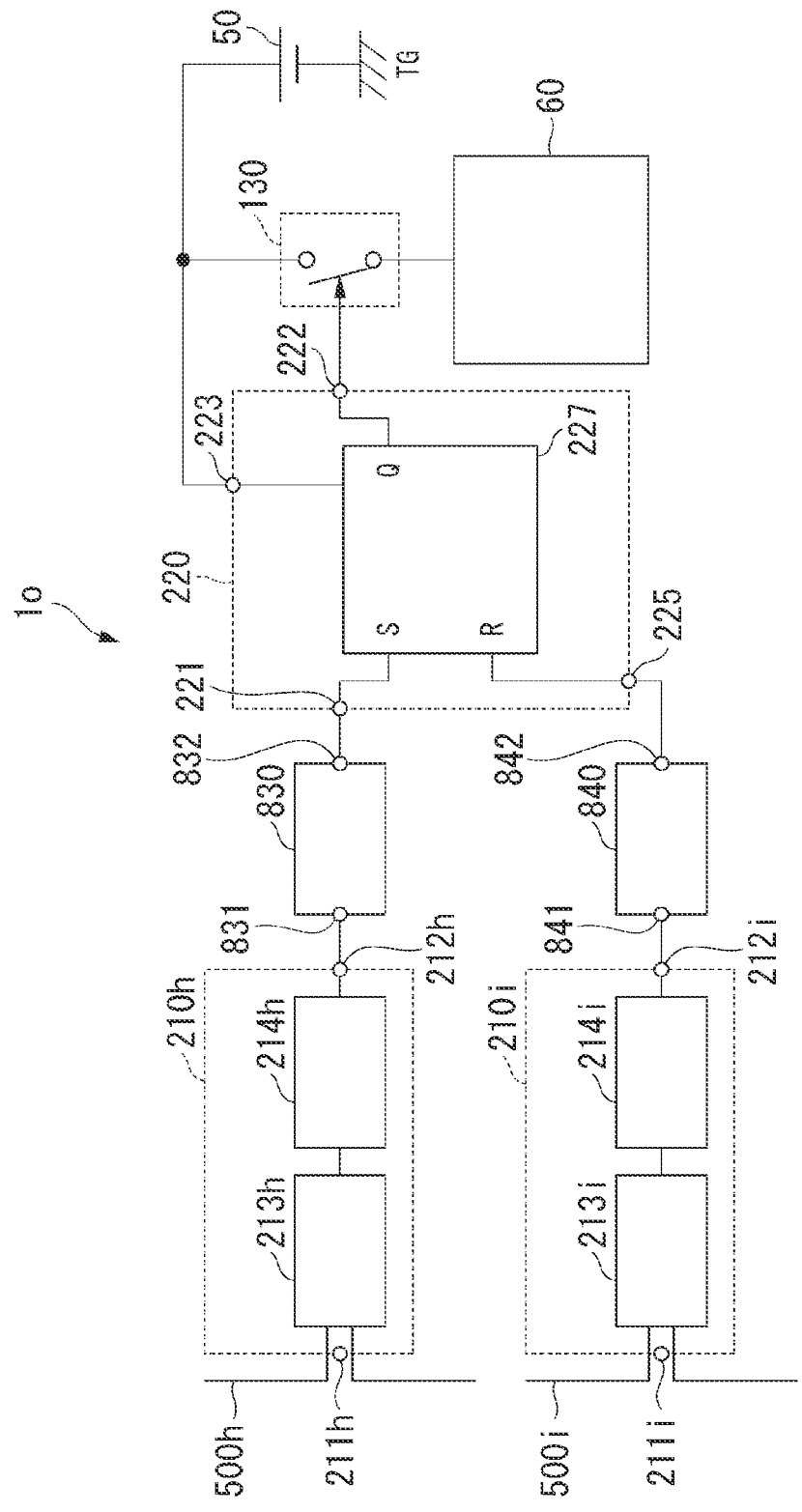
FIG. 27 is a diagram illustrating a modified example of the constitution of the latch module in the fifth embodiment.

FIG. 27 is a diagram illustrating a modified example of the constitution of the latch system 100 in the fifth embodiment. In FIG. 27, a latch module 1o includes a first antenna 500h, a second antenna 500i, a first power conversion circuit 210h, a first power adjustment circuit 830, a second power conversion circuit 210i, a second power adjustment circuit 840, a control circuit 220, a switch 130, a power supply 50, and a load 60.

In the following description, when a first power adjustment circuit 830 and a second power adjustment circuit 840 are not distinguished, they are referred to as a "power adjustment circuit" in some cases.

The first power adjustment circuit 830 includes an input terminal 831 and an output terminal 832. The input terminal 831 is connected to a first DC power output terminal 212h included in the first power conversion circuit 210h. The output terminal 832 is connected to a first input terminal 221 included in the control circuit 220. The first power adjustment circuit 830 steps down the DC electric power converted by the first power conversion circuit 210h and outputs the stepped-down DC electric power to the output terminal 832. That is to say, in this example, the first power adjustment circuit 830 is a step-down circuit. The first power adjustment circuit 830 reduces the DC electric power converted by the first power conversion circuit 210h when a gain of the first antenna 500h is larger than a gain of the second antenna 500i.

The second power adjustment circuit 840 includes an input terminal 841 and an output terminal 842. The input terminal 841 is connected to a second DC power output terminal 212i included in the second power conversion circuit 210i. The output terminal 842 is connected to a second input terminal 225 included in the control circuit 220. The second power adjustment circuit 840 steps down the DC electric power converted by the second power conversion circuit 210i and outputs the stepped-down DC electric power to the output terminal 842. That is to say, in this example, the second power adjustment circuit 840 is a step-down circuit. The second power adjustment circuit 840 reduces the DC electric power converted by the second power conversion circuit 210i when a gain of the second antenna 500i is larger than a gain of the first antenna 500h.

That is to say, in this example, the power adjustment circuit is a step-down circuit configured to step down a voltage of DC electric power converted on the basis of the radio waves received by an antenna on a high gain side when a gain of the first antenna 500h is different from a gain of the second antenna 500i.

The power adjustment circuit steps down a voltage of DC electric power so that the magnitude of the DC electric power input to the control circuit 220 is substantially the same. That is to say, the power adjustment circuit adjusts the DC electric power output from the first DC power output terminal 212h included in the first power conversion circuit 210h and the DC electric power output from the second DC power output terminal 212i included in the second power conversion circuit 210i so that the DC electric powers are made substantially the same as each other.

[Summary of Effects of Fifth Embodiment]

According to the above-described embodiment, the latch module 1 switches a connection state of the switch 130 by detecting first radio waves received by the first antenna 500h and second radio waves received by the second antenna 500i. The latch module 1 can switch the switch 130 from a non-conduction state to a conduction state even if the characteristics and gains of the first antenna 500h and the second antenna 500i are not the same. Furthermore, the latch module 1 can switch the switch 130 from a conduction state to a non-conduction state.

Also, according to the above-described embodiment, when a gain of the first antenna 500h is different from a gain of the second antenna 500i, the power adjustment circuit configured to adjust the magnitude of electric power converted on the basis of the radio waves received by an antenna on a high gain side is further provided. When the latch module 1 includes the power adjustment circuit, the magnitude of the DC electric power input to the control circuit 220 can be made substantially the same. Therefore, according to this embodiment, the control circuit 220 can be easily constituted of, for example, a comparator or the like without having a complicated mechanism.

According to the above-described embodiment, the power adjustment circuit is an attenuator configured to attenuate the radio waves received by an antenna on a high gain side when a gain of the first antenna 500h is different from a gain of the second antenna 500i. According to this embodiment, even if the characteristics of the first antenna 500h and the second antenna 500i are different from each other, when electric power is input to the first power conversion circuit 210h and the second power conversion circuit 210i, it is possible to make the electric power substantially the same and substantially the same circuit can be used for the first power conversion circuit 210h and the second power conversion circuit 210i. That is to say, according to this embodiment, even when the characteristics of the first antenna 500h and the second antenna 500i are different from each other, it is possible to easily constitute the circuit.

According to the above-described embodiment, the power adjustment circuit is a step-down circuit configured to step down a voltage of DC electric power converted on the basis of the radio waves received by an antenna on a high gain side when a gain of the first antenna 500h is different from a gain of the second antenna 500i. According to this embodiment, even if the characteristics of the first antenna 500h and the second antenna 500i are different from each other, when electric power is input to the control circuit 220, it is possible to make the electric substantially the same and substantially the same circuit can be used for the first power conversion circuit 210h and the second power conversion circuit 210i. That is to say, according to this embodiment, even when the characteristics of the first antenna 500h and the second antenna 500i are different from each other, it is possible to easily constitute the circuit.

Modified Example of Fifth Embodiment

In the design concept described above in detail, the two antennas provided in the latch module 1 have substantially the same characteristics or have electric power which is converted into substantially the same electric power when the electric power is input to the control circuit 220, in which both of the antennas can receive radio waves when a transmission point T1 configured to transmit the radio waves is in a far field. Therefore, in this embodiment, it is also possible to distinguish between the far field and the near field by intentionally making the characteristics of the two antennas different or converting these into electric powers of different magnitudes when they are input to the control circuit 220.

For example, when the transmission point T1 is located far away from the latch module 1, a constitution may be provided so that an amount of electric power received by one of the antennas is large and an amount of electric power received by the other of the antennas is small. In these cases, a constitution in which, when the transmission point T1 approaches the latch module 1, an amount of electric power received by each of the antennas is reversed may be provided. With such a constitution, the performance of one of the antennas can be reduced and the manufacturing costs can be reduced.

While the embodiments of the present invention have been described in detail above with reference to the drawings, the specific constitution is not limited to the embodiments and designs and the like within a range that does not depart from the gist of the present invention are also included. Furthermore, while the operation has been described from a current according to the electric power using the radio waves received by the antennas in the embodiments of the present invention, the operation may be described from a voltage according to the electric power using the radio waves received by the antennas.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An electronic circuit, comprising:
 a switch connected between a power supply configured to output direct current (DC) electric power and a load driven by DC electric power supplied from the power supply and configured to switch a connection state between the power supply and the load to any of a conduction state in which a supply of electric power from the power supply to the load is allowed and a non-conduction state in which the supply of electric power from the power supply to the load is cut off;

a first antenna capable of receiving radio waves;

a second antenna capable of receiving radio waves;

a first power conversion circuit including a first power input terminal to which electric power obtained when the first antenna receives radio waves is input and a first DC power output terminal configured to output DC electric power and configured to convert electric power input to the first power input terminal into DC electric power and output the converted DC electric power from the first DC power output terminal;

a second power conversion circuit including a second power input terminal to which electric power obtained when the second antenna receives radio waves is input and a second DC power output terminal configured to output DC electric power and configured to convert electric power input to the second power input terminal into DC electric power and output the converted DC electric power from the second DC power output terminal; and a control circuit including a first input terminal connected to the first DC power output terminal of the first power conversion circuit, a second input terminal connected to the second DC power output terminal of the second power conversion circuit, and an output terminal connected to the switch and configured to control the connection state of the switch, and configured to switch the connection state of the switch when a difference between electric power input from the first input terminal and electric power input from the second input terminal is larger than a predetermined value.

2. The electronic circuit according to claim 1, further comprising:

a power adjustment circuit configured to adjust a magnitude of electric power converted on the basis of radio waves received by either one of the first antenna or the second antenna which having the higher gain when a gain of the first antenna is different from a gain of the second antenna, wherein the power adjustment circuit adjusts DC electric power output from the first DC power output terminal and DC electric power output from the second DC power output terminal so that the DC electric powers are made substantially the same.

3. The electronic circuit according to claim 2, wherein the power adjustment circuit is an attenuator configured to attenuate radio waves received by either one of the first antenna or the second antenna which having the higher gain when a gain of the first antenna is different from a gain of the second antenna.

4. The electronic circuit according to claim 2, wherein the power adjustment circuit is a step-down circuit configured to step down a voltage of DC electric power converted on the basis of radio waves received by either one of the first antenna or the second antenna which having the higher gain when the gain of the first antenna is different from the gain of the second antenna.

5. The electronic circuit according to claim 1, wherein the first antenna and the second antenna have substantially the same characteristics and gain.

6. The electronic circuit according to claim 1, wherein the control circuit switches the connection state of the switch to the conduction state when electric power input from the first input terminal is larger than electric power input from the second input terminal, and switches the connection state of the switch to the non-conduction state when electric power input from the first input terminal is smaller than electric power input from the second input terminal.

7. The electronic circuit according to claim 1, wherein the control circuit includes a power detector.

8. The electronic circuit according to claim 7, wherein the power detector includes:

a current amplifier configured to amplify a current input to the second input terminal;

a current adder configured to add a current input to the first input terminal to a current amplified by the current amplifier; and a comparator configured to output a voltage according to the result of comparing the current after addition by the current adder with a predetermined current to the output terminal.

9. The electronic circuit according to claim 8, wherein the power detector further includes a gain switch configured to switch an amplification factor of the current amplifier in accordance with an output of the power detector.

10. The electronic circuit according to claim 9, wherein the first antenna and the second antenna are arranged apart at a prescribed distance from each other.

11. A module, comprising:

the electronic circuit according to claim 1;

a power supply configured to output DC electric power; and a load driven by DC electric power supplied from the power supply.

12. The module according to claim 11, wherein the module is accommodated in a waterproof housing.

13. A system, comprising:

the module according to claim 11; and a transmitter configured to transmit prescribed radio waves to the module.

14. The system according to claim 13, wherein, when the radio waves are 2.4 GHz, a distance between the transmitter and the module in which the module is able to detect radio waves transmitted by the transmitter is within 2 centimeters.

15. A module, comprising:

the electronic circuit according to claim 2;

a power supply configured to output DC electric power; and a load driven by DC electric power supplied from the power supply.

16. The module according to claim 15, wherein the module is accommodated in a waterproof housing.

17. A system, comprising:

the module according to claim 15; and a transmitter configured to transmit prescribed radio waves to the module.

18. The system according to claim 17, wherein, when the radio waves are 2.4 GHz, a distance between the transmitter and the module in which the module is able to detect radio waves transmitted by the transmitter is within 2 centimeters.

19. A module, comprising:

the electronic circuit according to claim 3;

a power supply configured to output DC electric power; and a load driven by DC electric power supplied from the power supply.

20. The module according to claim 19, wherein the module is accommodated in a waterproof housing.

* * * * *